(12) United States Patent
Ausserlechner

(10) Patent No.: US 10,295,644 B2
(45) Date of Patent: May 21, 2019

(54) SENSORS, SYSTEMS AND METHODS FOR COMPENSATING FOR THERMAL EMF

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 12 days.

(21) Appl. No.: 15/585,692

(22) Filed: May 3, 2017

(65) Prior Publication Data
US 2017/0299684 A1 Oct. 19, 2017

Related U.S. Application Data

(62) Division of application No. 13/920,777, filed on Jun. 18, 2013, now Pat. No. 9,671,486.

(51) Int. Cl.
*G01N 17/00* (2006.01)
*G01R 35/00* (2006.01)
*G01R 33/00* (2006.01)

(52) U.S. Cl.
CPC ....... *G01R 35/005* (2013.01); *G01R 33/0082* (2013.01)

(58) Field of Classification Search
CPC combination set(s) only.
See application file for complete search history.

(56) References Cited

U.S. PATENT DOCUMENTS

| 7,345,476 B2* | 3/2008 | Middelhoek | G01R 33/07 324/225 |
| 2004/0104724 A1* | 6/2004 | Sato | B82Y 25/00 324/224 |
| 2005/0077890 A1 | 4/2005 | Rannow et al. | |
| 2007/0046287 A1* | 3/2007 | Vervaeke | G01R 33/0094 324/251 |
| 2008/0074108 A1 | 3/2008 | Ausserlechner | |
| 2008/0238410 A1 | 10/2008 | Charlier et al. | |
| 2012/0020090 A1 | 1/2012 | Tong | |
| 2012/0028667 A1 | 2/2012 | Larsson | |
| 2013/0069641 A1 | 3/2013 | Motz | |

(Continued)

*Primary Examiner* — Lisa M Caputo
*Assistant Examiner* — Nasir U. Ahmed
(74) *Attorney, Agent, or Firm* — Eschweiler & Potashnik, LLC

(57) ABSTRACT

Embodiments relate to sensor systems and methods that can compensate for thermal EMF effects that can cause residual offset and other errors in sensor systems. In one embodiment, a sensor system comprises at least one temperature sensor arranged proximate a primary sensor element, e.g., a Hall plate in an embodiment in which the sensor system comprises a Hall-effect magnetic field sensing system, though other types of magnetic field and sensors more generally can be used in other embodiments. In another embodiment, a plurality of temperature sensors can be used, with each one arranged proximate a different sensor contact or element. In an example in which the Hall plate is operated according to a spinning operation scheme, the at least one temperature sensor can be configured to sense a temperature in each operating phase, and the individual sensed temperatures can be combined and used to provide a temperature-dependent compensation signal.

14 Claims, 13 Drawing Sheets

(56) References Cited

U.S. PATENT DOCUMENTS

| | | |
|---|---|---|
| 2013/0127453 A1 | 5/2013 | Ausserlechner |
| 2014/0028304 A1 | 1/2014 | Ausserlechner |
| 2014/0084911 A1 | 3/2014 | Ausserlechner |
| 2014/0225597 A1* | 8/2014 | Romero ............. G01R 33/0023 324/207.12 |

* cited by examiner

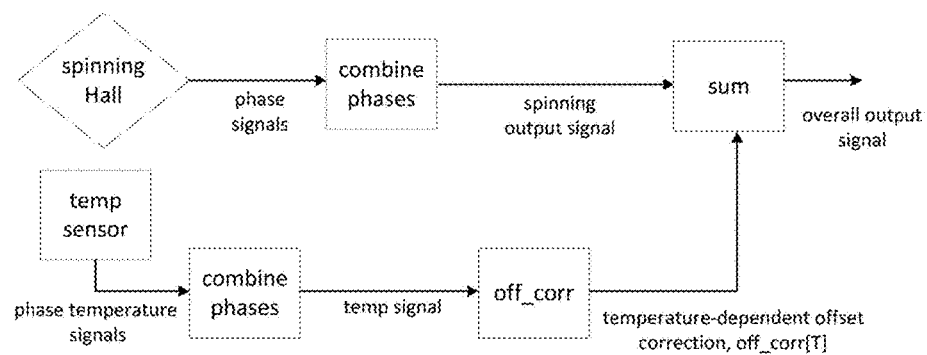
FIG. 1
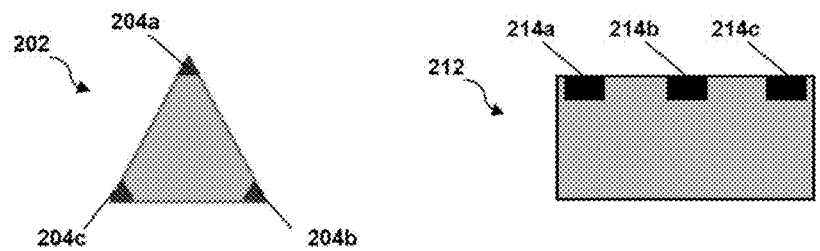
FIG. 2A  FIG. 2B

SENSORS, SYSTEMS AND METHODS FOR COMPENSATING FOR THERMAL EMF

REFERENCE TO RELATED APPLICATION

This application is a divisional of U.S. application Ser. No. 13/920,777 filed on Jun. 18, 2013, the contents of which are incorporated by reference in their entirety.

FIELD

The invention relates generally to sensors and more particularly to sensors, systems and methods which compensate for effects of thermal electromotive force (EMF).

BACKGROUND

Sensors can be affected by many different internal and external characteristics that can make the sensor output signals less accurate. One of these characteristics is thermal electromotive force (EMF), which relates to the effects temperature can have on the movement of electric charge in a material. A temperature gradient in a material, for example, can affect charge flow in the material much like an applied electric field, by pushing charges in a particular direction. This can be amplified in the presence of electric or magnetic fields, or concentration gradients. Thermal EMFs also can cause temperature-related charges in two primary situations: first, an inhomogeneous temperature (i.e., a temperature gradient) in a homogeneous material, or a homogeneous temperature in an inhomogeneous material. The second can occur, e.g., at device contacts, with the voltage referred to as a thermal contact voltage. Both are undesirable with respect to sensor operation and output signal accuracy.

There are many different ways in which temperature can influence charge, only some of which are related to thermal EMF. For example, magnetic sensitivity in Hall effect devices and resistivity changes due to temperature generally are not related to any thermal EMF effects and therefore may not be addressed or compensated for by embodiments discussed herein. Sensor output signals, particularly when the sensors operate according to spinning current or voltage schemes, however, can be affected by thermal EMF. In one example, a sensor system comprises Hall plates which are operated in sequential operating phases. Different terminals of the Hall plates are tapped as supply and output terminals in each operating phase, such that the current flow direction or spatial distribution of current is different from phase to phase. A spinning output signal can be obtained by combining the signals from the individual operating phases. Hall plates, in fact magnetic field sensors in general, can experience offset errors which result in an output signal when there is no applied magnetic field. Offset errors in each operating phase can be largely canceled in spinning schemes due to the combination of the individual operating phase signals, such that little or no residual offset remains in the combined output signal.

Unfortunately, residual offset errors often remain, such that some spinning scheme sensor systems provide residual offset compensation. Referring to FIG. 1, such systems typically comprise a temperature sensor arranged in close proximity to the Hall plate because offset correction usually is not constant over temperature. The system therefore can sense the temperature, determine a compensation signal based on the temperature, and take this compensation signal into account in the spinning output signal. Thus, this conventional approach combines the phase temperature signals only by averaging, which can be considered equivalent to an implicit low-pass filtering of a slow temperature sensor. A challenge, however, is determining the compensation signal. Because the residual offset of spinning Hall schemes is stochastic, it depends on the actual individual device, and the temperature of this device, and it can change during the operational lifetime of the device. Thus, even if individual device calibration could be performed efficiently and effectively during end-of-line testing, changes over the lifetime of the device can reduce the accuracy of the calibration and result in thermal EMF-related residual offset errors.

Conventional solutions presume that thermal EMF effects are canceled through use of polarity inversion in sequential operating phases (i.e., only the polarity of the supply changes) and a spinning voltage rather than current technique. This may not be the case, however, because in practice the temperature distribution can change when the polarity of the supply voltage is inverted.

SUMMARY

Embodiments relate to sensors, systems and methods for estimating and/or reducing residual offset errors related to thermal electromotive force (EMF).

In an embodiment, a sensor system comprises a first sensor element arranged on a substrate and configured to sense a physical quantity in at least one operating phase; a second sensor element arranged thermally proximate the first sensor element on the substrate and configured to sense a spatial gradient of temperature within the first sensor element during at least a portion of the at least one operating phase; and circuitry coupled to the first sensor element and the second sensor element and configured to combine a signal of the first sensor element related to the sensed physical quantity with a signal of the second sensor element related to the sensed spatial gradient of temperature sampled during the same portion of the at least one operating phase to obtain an output signal indicative of the physical quantity.

In an embodiment, a sensor configured to sense a physical quantity comprises a first electrically conducting region of a substrate comprising a first contact; a first terminal coupled to the first contact and comprising a material having a first effective Seebeck coefficient; a second terminal coupled to the first contact and comprising a material having a second effective Seebeck coefficient; and circuitry selectively coupled to the first and second terminals to tap first and second signals and combine the first and second signals.

In an embodiment, a device comprises an output signal contact coupled to a first wire and to a second wire; and a reference contact coupled to a third wire and to a fourth wire, wherein a difference in an effective Seebeck coefficient between the first wire and the second wire is substantially the same as a difference in an effective Seebeck coefficient between the third wire and the fourth wire.

In an embodiment, a method comprises obtaining a first signal by sensing a first physical quantity in at least one operating phase by a first sensor; obtaining a second signal by sensing a spatial gradient of temperature of the first sensor during a portion of the at least one operating phase when the first physical quantity is sensed; and reducing an offset error in the first signal by combining the first and second signals from the at least one operating phase.

In an embodiment, a method comprises obtaining a first set of signals in a plurality of operating phases by sensing a magnetic field at a set of contacts tapped by a first set of terminals having a first effective Seebeck coefficient; obtaining a second set of signals in the plurality of operating phases by sensing a magnetic field at the set of contacts tapped by a second set of terminals having a second effective Seebeck coefficient different from the first effective Seebeck coefficient; and combining the first and second sets of signals.

BRIEF DESCRIPTION OF THE DRAWINGS

The invention may be more completely understood in consideration of the following detailed description of various embodiments of the invention in connection with the accompanying drawings, in which:

FIG. 1 is a block diagram of a sensor system.

FIG. 2A is a diagram of a Hall plate according to an embodiment.

FIG. 2B is a diagram of a vertical Hall sensor device according to an embodiment.

Figure 2C:
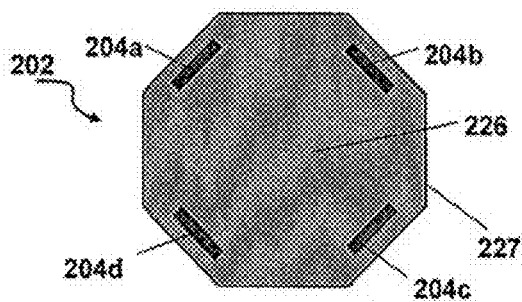
FIG. 2C is a diagram of a Hall plate according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to sensor systems and methods that can compensate for thermal EMF effects that can cause residual offset and other errors in sensor systems. In one embodiment, a sensor system comprises at least one temperature or temperature gradient sensor arranged proximate a first sensor element configured to sense a physical quantity, such as a magnetic field, temperature, pressure, force, mechanical stress, or some other physical quantity. For example, the first sensor element comprises, e.g., a Hall plate in an embodiment in which the sensor system comprises a Hall-effect magnetic field sensing system, though other types of magnetic field sensors, and sensors more generally, can be used as the first sensor in other embodiments. In another embodiment, a plurality of temperature sensors can be used, with each one arranged proximate a different sensor contact or element. In an example in which the Hall plate is operated according to a spinning operation scheme, the at least one temperature sensor can be configured to sense a temperature in each operating phase, and the individual sensed temperatures can be combined and used to provide a temperature-dependent compensation signal.

Thermal EMF, the characteristic for which embodiments aim to compensate, can be quantified by the Seebeck coefficient for any particular material. For n-doped silicon with a concentration of about $10^{16}/cm^3$, which is typical for the active region of Hall effect devices discussed herein in some embodiments, the Seebeck coefficient is about $-1,200$ $\mu V/°$ C. at room temperature. N-doped poly-silicon with a resistivity of about 7 milli-Ohms*cm has a Seebeck coefficient of about 200 $\mu V/°$ C., and n-doped poly-silicon with a resistivity of about 0.8 milli-Ohms*cm has a Seebeck coefficient of about 80 $\mu V/°$ C. Aluminum, often used for metal interconnect lines in integrated circuit technologies, has a negligible Seebeck coefficient, only about $-0.5$ $\mu V/°$ C. These Seebeck coefficients are representative examples of materials which could be suitable for use in embodiments, but this list is not exhaustive, nor is it limiting with respect to materials which can or may be used, as appreciated by those skilled in the art. Additionally, the Seebeck coefficient is not critical, and embodiments are related to reducing or eliminating the underlying thermal EMF.

Embodiments relate to situations in which output signals are tapped at terminals, which can be subject to small additive voltages caused by thermal EMF. In most cases the signals are tapped between two terminals which are at different temperatures, and therefore the tapped signal has a small additive part that is proportional to the temperature difference between the terminals. In other cases the signals can be tapped between a terminal and a reference terminal, such as, e.g., one that is at ground potential. Here again the terminal and the reference terminal can have different temperatures which can cause small superimposed additive thermo-EMF signals. In still other cases a signal can be tapped at the same contact at different times (e.g., in different operating phases), with multiple sampled values then combined to provide an overall signal. If the temperature at the contact changes over time, a small additive thermo-EMF can be superimposed on the signals. It should be kept in mind that the different temperatures at the terminals do not affect the isothermal signal (i.e., the signal if the terminals were at identical temperatures), so the isothermal signal is not multiplied by some factor that depends on the temperature difference. Instead, the signal tapped between terminals at different temperatures is equal to the isothermal signal plus a small additive thermo-EMF contribution, which is proportional to the temperature difference between the terminals. It is this thermo-EMF contribution which embodiments aim to address.

Referring to FIG. 2A, a simplified diagram of a Hall plate 202 is depicted. The particular depiction in FIG. 2 is not to scale. The diagram of FIG. 2, as well as others which may be used herein, are for example and illustrative purposes and are complemented by this discussion, the other figures and this entire application as a whole. Some figures can include block diagrams, wherein the blocks can represent physical objects, functions, concepts and/or combinations thereof. Moreover, while some embodiments discussed herein refer to magnetic field sensors, including Hall and vertical Hall devices, other sensors can be used in other embodiments, and the use and depiction of Hall plate 202 in this embodiment is not to be considered limiting.

Hall plate 202 comprises three contacts 204a, 204b and 204c. In embodiments, Hall plate 202 can be operated in a spinning scheme, in which contacts 204a, 204b, 204c can be differently coupled as supply and signal contacts in different operating phases. As previously mentioned, in a spinning current or voltage scheme, different contacts of Hall plate 202 are coupled in each sequential operating phase such that the current flow direction or spatial distribution of current in Hall plate 202 is different from one operating phase to the next. The number of contacts and the number of operating phases can vary in embodiments.

Figure 2D:
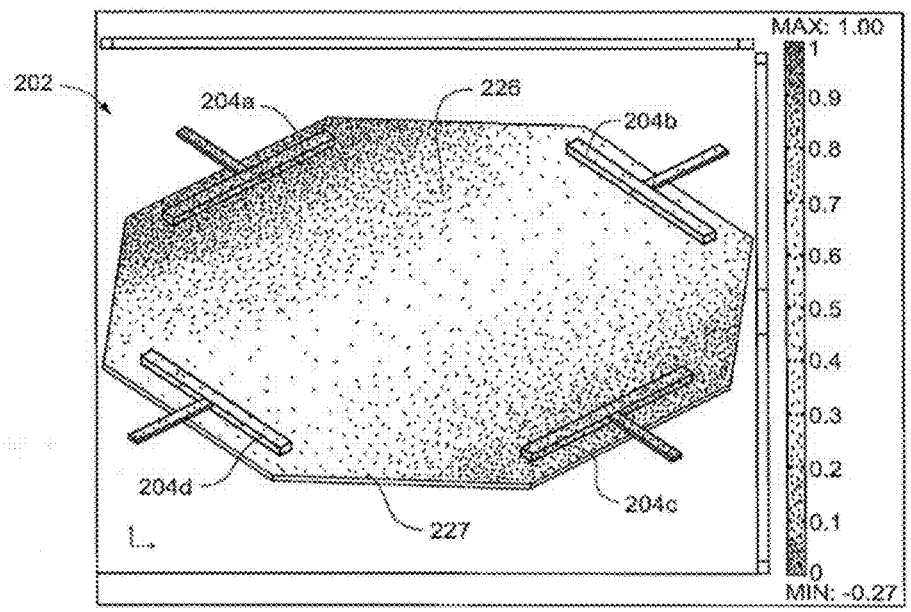
FIG. 2D is a perspective view of a potential distribution in a Hall plate during an operating phase according to an embodiment.

While FIG. 2A depicts a single Hall plate 202, in other embodiments, the sensor can comprise a plurality of Hall plates 202 differently coupled with one another in a similar manner in different operating phases. FIG. 2B depicts one example of a vertical Hall device 212 comprising three contacts 214a, 214b and 214c and which can be operated similarly to Hall plate 202 except that vertical Hall device 212 is sensitive to a different magnetic field component than Hall plate 202, as appreciated by those skilled in the art. FIG. 2C depicts an example octagonal Hall plate 202 comprising four contacts or contact diffusions 204a, 204b, 204c, 204d. As previously mentioned, the size, shape, configuration and number of contacts, among other characteristics, can vary in embodiments, and Hall plate 202 will be used generally herein to refer to a Hall plate without limit with respect to the embodiments of FIGS. 2A, 2C or other Hall plates depicted, vertical Hall device 212 of FIG. 2B, or other particular characteristics which can vary from embodiment to embodiment. Hall plate 202 comprises an active region 226 and a boundary or isolation of active region 226 at perimeter 227. FIG. 2D depicts an example potential distribution within Hall plate 202 in operation. The distribution of potential within Hall plate 202 leads to distribution of temperatures within Hall plate 202, or a spatial distribution of temperature. The effects of thermal EMF can influence the distribution of potential within Hall plate 202, and therefore also the spatial distribution of temperature therein.

In one embodiment, at least one temperature sensor can be arranged proximate Hall plate 202. For example, Hall plate 202 can be arranged on a semiconductor substrate, and a temperature sensor can be arranged in close physical proximity to one or more contacts 204a, 204b, 204c, to Hall plate 202 generally, or another relevant portion of Hall plate 202. In one embodiment, a single temperature sensor is used, and that single temperature sensor is configured to sense temperatures in Hall plate 202 associated with the different power dissipations that can occur in Hall plate 202 in different operating phases of the spinning scheme. From these measurements, system 100 can estimate thermal EMF changes or fluctuations from phase-to-phase. In another embodiment, the temperature sensor comprises a plurality of temperature sensor elements, for example one associated with each contact of Hall plate 202, one positioned between each adjacent contact of Hall plate 202, and/or one comprising a plurality of wires or terminals coupled to or with Hall plate 202 such that a spatial distribution of temperature in Hall plate 202 can be sensed. In essence, however, at least one temperature sensor aims to sense and measure thermal EMF mismatches between different contacts, e.g., two contacts being used in a differential measurement, in Hall plate 202.

The temperature sensor can also be used in embodiments comprising single output voltages or currents, in contrast to differential outputs. In these embodiments, the total thermal EMF contributes to the output signal at an output contact. One example can be vertical Hall device 212 of FIG. 2B, in which current flows between two contacts and an output signal is a potential measured at the third contact. Thus, regardless of whether the particular sensor implemented is operated in a single phase or according to a multi-phase spinning current or voltage scheme, the thermal EMF at each output or signal terminal in each operating phase is relevant to the compensation effort. Vertical Hall device 212 also can be used in spinning schemes in other embodiments.

The temperature sensor can be sampled during sampling of Hall plate 202 in embodiments, such that an instantaneous temperature can be obtained. In one example, operating phases of a sensor device comprising Hall plate 202 are at least about 1 micro-second (µs) long, for example about 2 µs, and a temperature sensor that can keep pace and sample signals at appropriate time intervals is needed. In embodiments, therefore, the temperature sensor is one which has a low thermal mass and heat retention. The temperature sensor also can have a high bandwidth in embodiments. For example, if the Hall sensor 202 is operated in a spinning current scheme at 500 kHz, a suitable bandwidth can be about 1 MHz. It is also advantageous in embodiments for the temperature sensor to have a high spatial resolution in order to detect spatial gradients of temperature in Hall plate 202. In embodiments, the spatial resolution of the temperature sensor is at least about 10 micrometers (µm), for example about 1 µm. Additionally, however, the temperature sensor can be relatively simple in embodiments, to avoid adding complexity and expense to the overall sensor system given that it, and the underlying goal of thermal EMF compensation, can be an add-on feature in various sensor systems and implementations. The temperature sensor also should not introduce or increase parasitic effects, such as high temperature leakage currents or stray capacitances, particularly those which could have an effect on the Hall sensor. Thus, temperature sensors which require too much power, highly sophisticated signal processing, a large area, or other features which can raise their cost or need for resources within a sensor system can be less suitable in most embodiments but could still have applicability in certain specialized applications.

Whether the temperature sensor comprises a single temperature sensor element or a plurality thereof, and whether the temperature sensor is implemented according to the embodiments of FIG. 3, FIG. 4 or some other embodiment discussed herein below, the temperature sensor can operate in each operating phase of a spinning scheme of Hall plate 202 or another sensor device. In other embodiments, the temperature sensor need not operate in every phase. The various individual phase temperature signals from the temperature sensor can be combined, while the individual phase signals from Hall plate 202 also can be combined, by the same or different circuitry, on-chip or off. A temperature signal and a spinning output signal can be determined, with the temperature signal used to determine a temperature-dependent offset correction signal, which can be combined with the spinning output signal to provide an overall system output signal.

Figure 2E:
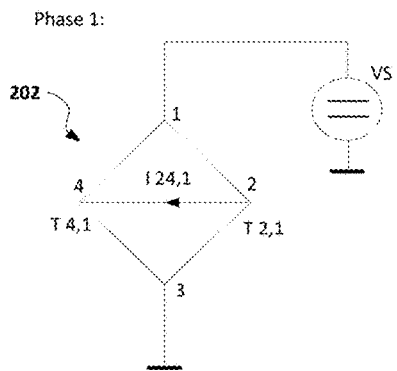
FIG. 2E is a coupling arrangement of a Hall plate in a first operating phase according to an embodiment.
Figure 2F:
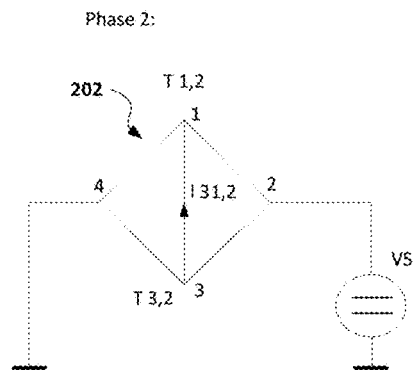
FIG. 2F is a coupling arrangement of a Hall plate in a second operating phase according to an embodiment.
Figure 2G:
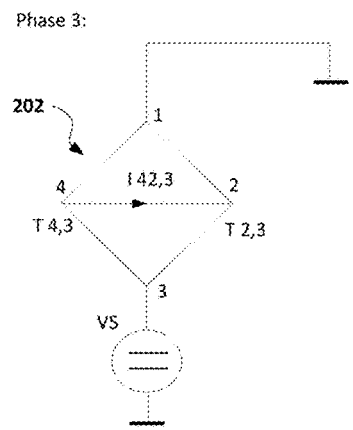
FIG. 2G is a coupling arrangement of a Hall plate in a third operating phase according to an embodiment.
Figure 2H:
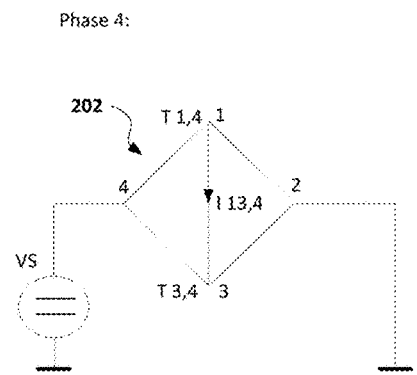
FIG. 2H is a coupling arrangement of a Hall plate in a fourth operating phase according to an embodiment.
Figure 2I:
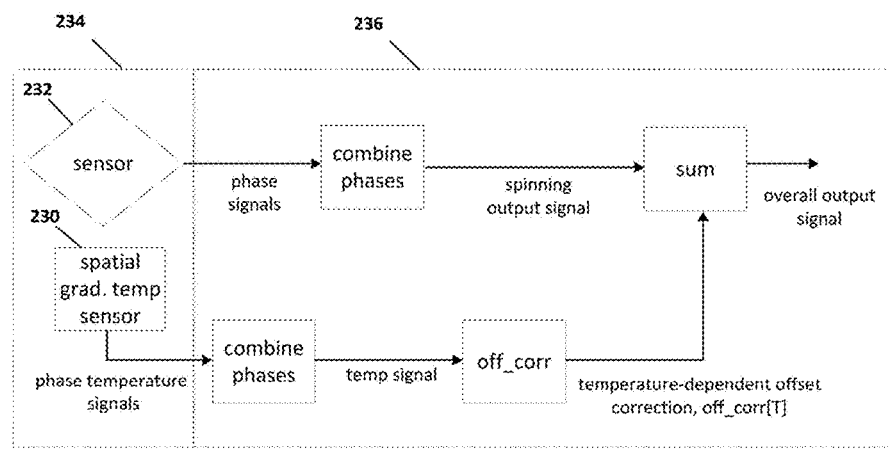
FIG. 2I is a block diagram of a sensor system according to an embodiment.

For example, and referring to FIG. 2I, a spatial gradient temperature sensor 230 can be arranged thermally proximate another sensor element 232, which can comprise a spinning Hall sensor or some other sensor in various embodiments, on a substrate 234. Sensor 230 is configured to sense a spatial gradient of temperature within sensor element 232 during at least a portion of at least one operating phase. For example, sensor 232 can be operated in a plurality of operating phases according to a spinning scheme in one embodiment. Circuitry 236, which can be arranged on or off of substrate 234 in embodiments, is coupled to sensors 230 and 232 and can be configured to combine signals of sensor 232 related to a sensed physical quantity (e.g., a magnetic field) in each of at least one operating phases, and to combine signals from sensor 230 related to a sensed spatial gradient of temperature in sensor 232 sampled during the same portion of the at least one operating phase. Those signals can then be combined to obtain an overall output signal indicative of the physical quantity. Using the combined signals from sensor 230, an offset correction can be determined and used in the combining to obtain the overall output signal, whereby that overall output signal is corrected for an offset related to thermal EMF.

Turning to specific example embodiments of a temperature and/or spatial gradient temperature sensor, in one example implementation the sensor comprises a pn-junction. Pn-junctions are often used to measure temperature on semiconductor substrates and thus can be suitable in various embodiments. Pn-junctions also have the advantage of being relatively easily arranged in close proximity to the contacts of, e.g, Hall plate 202. One example embodiment of a temperature sensor 104 comprising a pn-junction is depicted in FIG. 3. Temperature sensor 104 is arranged proximate a Hall plate 202, in particular contact 204a, spaced apart on a substrate 302 by a distance d with optional galvanic isolation. In other embodiments, temperature sensor 104 and Hall plate 202 can be electrically coupled, though this would have an effect on the performance of one or both of Hall plate 202 and sensor 104 and therefore may not be suitable in all implementations.

Temperature sensor 104 comprises an n-tub 304 and a p-tub 306, though these can be reversed in other embodiments, and is biased by a constant current source 308. The voltage across current source 308 is a strong function of temperature and thus can be used as a temperature sensor. Additional components not specifically depicted, including signal conditioning circuitry components like precision amplifiers and analog-to-digital converters (ADC) can be included in various embodiments.

Figure 3:
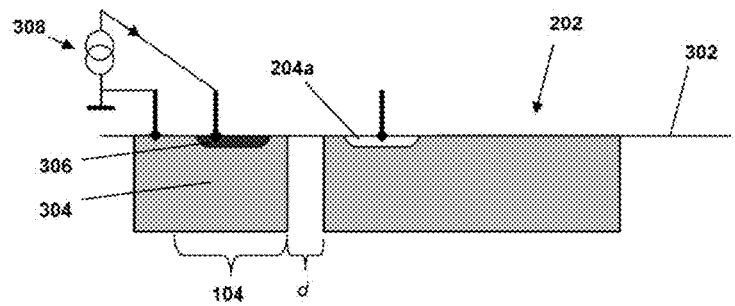
FIG. 3 is a side cross-sectional view of an arrangement of first and second sensor devices according to an embodiment.

An alternative implementation to that depicted in FIG. 3 is depicted in FIG. 4. Here, temperature sensing is integrated with a Hall or other sensor or type of device by providing additional contacts, terminals, wires, and/or other elements to sense temperatures and/or spatial gradients of temperature in Hall plate 202. The temperature sensing of the embodiment of FIG. 4 can be simpler than that of FIG. 3 and can determine the temperature or a temperature gradient at or within contacts of Hall plate 202 based on thermal voltage differences between different materials.

Figure 4A:
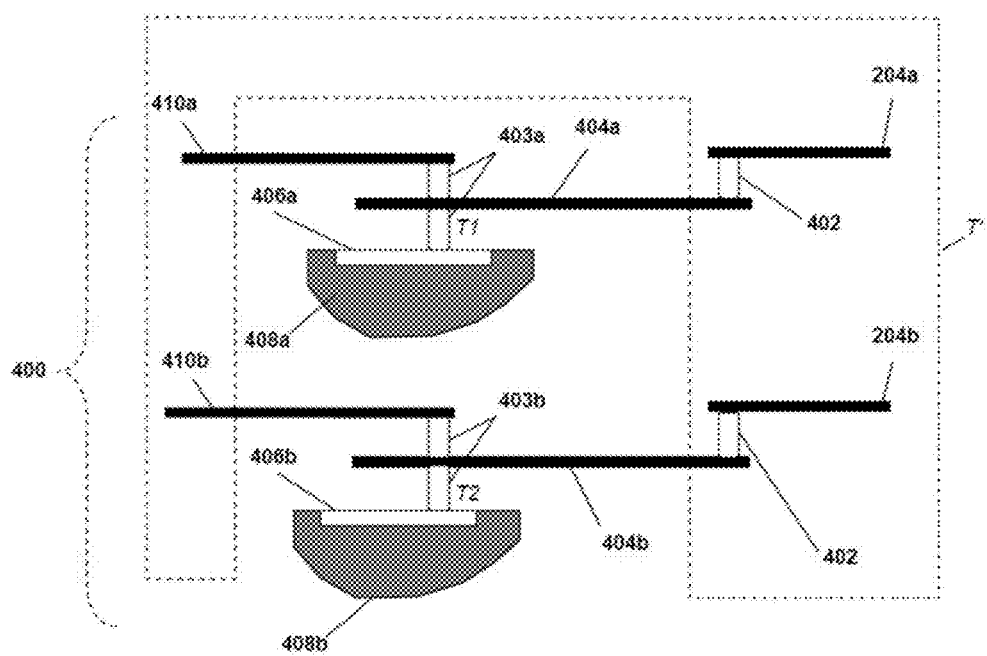
FIG. 4A is a diagram of a sensor coupling arrangement according to an embodiment.
Figure 4B:
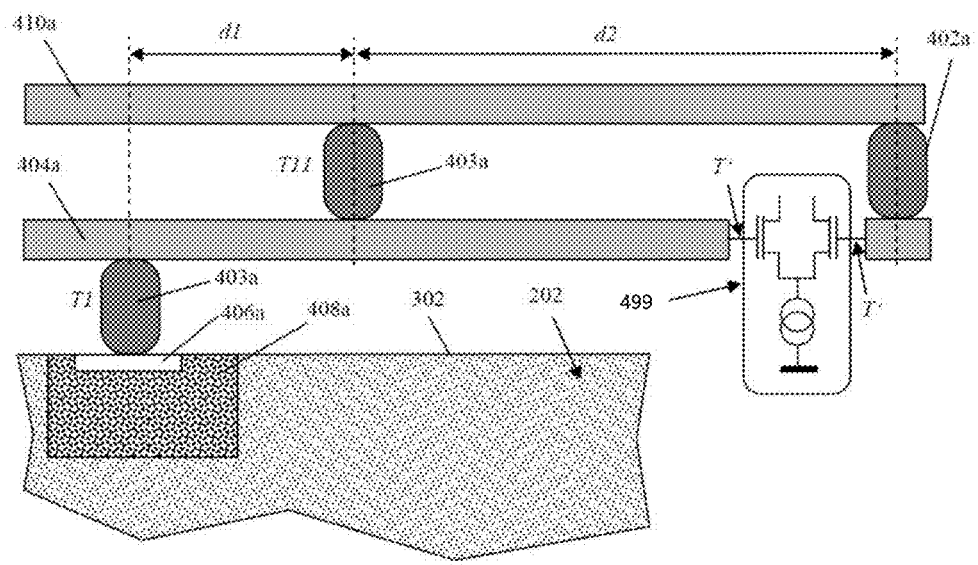
FIG. 4B is a diagram of a sensor coupling arrangement according to an embodiment.

In FIG. 4A, two terminals 204a and 204b of a Hall plate 202 (e.g., as depicted in FIG. 2C or another figure, or having some other configuration whether explicitly depicted or not herein) are shown. Terminals 204a and 204b can comprise wires, metal lines or some other suitable configuration in embodiments. In general, a terminal or a wire can be a device, circuit or circuit component with a resistance that is less than about ten times a signal output resistance of a sensor device at the respective contact which the terminal or wire taps, though this can vary in embodiments. It can be advantageous in embodiments to have wires or terminals with a low resistance and low parasitics. Terminals 204a and 204b, as well as terminals 410a and 410b, generally are at the same temperature T'. Though not depicted in FIG. 4A, terminals 204a and 240b can be coupled (e.g., via one or a stack of tungsten plugs) to transistor pairs in a signal amplifier or other circuitry, also arranged isothermally.

The circuitry and elements of FIG. 4A can be arranged relative to one or more contacts of a Hall plate or other device, and the Hall plate can comprise a low-doped n-region in one embodiment, or some other configuration or composition in other embodiments. Terminals 204a and 204b are each coupled by plugs 402 to an interconnect line 404a and 404b, respectively, which can be arranged between inter-metal oxide layers in or on substrate 400. In embodiments, plugs 402 can comprise tungsten-filled holes which have been etched or otherwise formed in inter-metal oxide layers of substrate 400, though other materials, configurations and methods of formation can be used in other embodiments. Interconnect lines 404a and 404b can comprise lines, wires or other suitable structures and couple contacts 204a and 204b of the sensor with contact diffusions 406a and 406b, respectively, via various additional plugs 403a, 403b, which can be the same as or different from each other and/or plugs 402 in embodiments. In one embodiment, contact diffusions 406a and 406b comprise shallow n+S/D contact diffusions formed in regions 408a and 408b. Contact diffusions 406a and 406b each are coupled to terminals 410a and 410b via plugs 403a and 403b, respectively, and each can comprise an output contact of the sensor for providing a signal related to the physical quantity sensed by the sensor, or a reference point to be used in sensing a temperature difference between two points.

In embodiments, terminals 410a and 410b can comprise wires, metal lines or other suitable materials or structures. In general, elements 204a, 204b, 404a, 404b, 410a and 410b depicted in FIG. 4A each can be considered to be wires, terminals, interconnects or some other structure, including in different contexts given that the figure is a partial representation and merely exemplary, though different terms (e.g., interconnect lines vs. terminals and/or wires) may be used herein for purposes of example and illustration. What can be of more interest in embodiments is the Seebeck coefficient of and/or material which those elements 204a, 204b, 404a, 404b, 410a and 410b comprise, particularly when considered relative to one another and with respect to where (i.e., between which terminals and/or wires, and/or between contacts) signals are tapped or otherwise considered in various embodiments.

For example, in embodiments, interconnect lines 404a and 404b comprise a different material and/or have a different Seebeck coefficient than terminals 410a, 410b. In one embodiment, interconnect lines 404a and 404b comprise a semiconductor material, such as polysilicon, silicon, germanium, a single-crystal semiconductor material or a polycrystalline semiconductor material, though other materials can be used in other embodiments, such that the material of interconnect lines 404a and 404b has a different contact voltage than the material of terminals 410a, 410b. In another embodiment, the materials can be selected to maximize a difference in Seebeck coefficients therebetween. Thus, there can be a difference in thermal EMF between the materials which can be sensed at terminals 410a and 410b, and at terminals 204a and 204b, and used to measure the thermal EMF. Herein throughout, an example in which interconnects 404a and 404b comprise polysilicon and terminals 410a and 410b comprise a metal generally will be used, though this example is not be to limiting with respect to other embodiments. The potential therefore can be tapped at the ends of terminals 410a and 410b, but also at terminals 204a and 204b, such that the terminals 204a and 204b can be used to measure a differential signal that can be compared with a differential signal at terminals 410a and 410b, which should differ from one another by the thermal contact voltages between the polysilicon of interconnect lines 404a and 404b and the metal of interconnect lines 410a and 410b.

In other words, a signal measured between terminals 410a and 410b can include some unknown thermal EMF contribution caused at least in part by different temperatures T1, T2 of contacts 406a, 406b, respectively, and a signal measured between terminals 204a and 204b can include the same unknown thermal EMF contribution in addition to a contribution from polysilicon interconnect lines 404a and 404b. There is a strong correlation between the additional polysilicon contribution and the unknown thermal EMF contribution, because they are proportional to the temperature difference T1-T2 of contacts 406a and 406b. Hence, the following can be used:

$$V(C1')-V(C2')=F[B]+\text{Off} \text{ and } V(C1'')-V(C2'')=F[B]+\text{Off}''$$

where F[B] is a function of the magnetic field, with F[0]=0, and Off''=Off+k(T1-T2), with k being a difference in the Seebeck coefficient of the materials of terminals 410a and 410b and interconnect lines 404a and 404b. C1' represents terminal 410a, C2' represents terminal 410b, C1'' represents terminal 204a and C2'' represents terminal 204b in one operating phase, though the coupling arrangements will change from one operating phase to the next. Referring specifically to FIG. 4:

$$V(204a)-V(204b)=k(404a)*(T1-T')+k(408)*(T2-T1)+V(408ab)+k(404b)*(T'-T2)$$

$$V(410a)-V(410b)=k(410a)*(T1-T')+k(408)*(T2-T1)+V(408ab)+k(410b)*(T'-T2)\rightarrow V(204a)-V(204b)-(V(410a)-V(410b))=(k(404a)-k(410a))*(T1-T')+(k(404b)-k(410b))*(T'-T2)$$

An assumption here is that conductive regions 408a and 408b have an effective Seebeck coefficient k(408) and that at isothermal conditions (T1=T2) a voltage V(408ab) (e.g., an output voltage of a Hall effect device) is present between regions 408a and 408b tapped at, e.g., contact diffusions 406a and 406b. This assumes that a difference in the effective Seebeck coefficients between wire or interconnect 404a and wire or terminal 410a is the same as the difference in the effective Seebeck coefficients between interconnect 404b and wire or terminal 410b. This can be addressed in embodiments, as discussed herein above, by interconnects 404a and 404b comprising the same material, and wires or terminals 410a and 410b comprising the same material. Note that it is the "effective" Seebeck coefficient which is of interest because an individual Seebeck coefficient of one portion or material could be the same. The effective Seebeck coefficients of other parts or portions of the sensor system are generally irrelevant, so long as the parts or portions are generally at a homogeneous temperature. For example, in FIG. 4A the effective Seebeck coefficients of plugs 402 comprising tungsten are irrelevant, because there are no spatial temperature gradients within each of them. Therefore, it makes no difference if terminal 410a is coupled to contact diffusion 406a directly or via a single tungsten plug or via a stack of two or more tungsten plugs, as long as each tungsten plug has no significant temperature difference within its body. Thus, in FIG. 4A it would also be possible to have a first tungsten plug between contact 406a and wire 404a and to have a stack of two further tungsten plugs between contact 406a and terminal 410a such that there is no direct contact between the stack of the two further tungsten plugs and wire 404a. In practice, a large number of tungsten plugs may be used between contact diffusion 406a and wire 404a or wire 410a, all of them electrically connected in parallel. Since the contact diffusions have finite size, space for tungsten plugs is limited there, and so one is usually inclined to stack layers, each layer having a large number of parallel connected plugs, as shown in FIG. 4A exemplarily for a single plug per layer. Thus, $$V(204a)-V(204b)-(V(410a)-V(410b))=(k(404a)-k(410a))*(T1-T2)$$

This enables a measurement of temperature difference T1-T2 if the Seebeck coefficients as mentioned above (e.g., between wire or interconnect 404a and wire or terminal 410a, and between interconnect 404b and wire or terminal 410b) are different.

The offset of the first sensor (e.g., the Hall effect device) comprises a raw offset Off and a thermoelectric contribution $\text{Off}_{therm}$ according to Off'=Off+$\text{Off}_{therm}$. The thermoelectric contribution $\text{Off}_{therm}$ has a strong correlation with the temperature difference T1-T2.

While this is valid for a single operating phase, in a spinning scheme Hall plate 202 is operated in several phases, and a total signal is computed as a sum over all individual phases:

$$S'\Sigma(V(C_1')-V(C_2'))=\Sigma(F[B]+\text{Off}')=\Sigma(F[B]+\text{off}+\text{Off}_{therm})$$

measured at terminals 410a and 410b, and $$S''=\Sigma(V(C_1'')-V(C_2''))=\Sigma(F[B]+\text{Off}'')=\Sigma(F[B]+\text{Off}+k(T_1-T_2)+\text{Off}_{therm})$$

measured at terminals 204a and 204b, with the indices changing according to the operating phases. The difference can then be computed by the sensor system:

$$S''-S'=\Sigma k(T_1-T_2)$$

Due to the strong correlation, this difference can be used to estimate the residual offset $\Sigma\text{Off}_{therm}$. One way to obtain this estimation is by a multiplication with a predefined factor x:

$$\Sigma\text{Off}_{therm}\approx x\Sigma k(T_1-T_2)$$

This factor x can depend on the technology and the geometry of the Hall sensor, as well as on the temperature, operating frequency, electric biasing and any mechanical stress acting on the sensor. In embodiments, x can be determined based on characterization of sensor devices in the laboratory or manufacturing-level testing. Once $\Sigma \text{Off}_{therm}$ is determined, it can be subtracted from S' to get a signal without offset due to thermo-EMF. Due to spinning Hall schemes, the purely resistive offset (i.e., the one which can be described by an asymmetric Wheatstone bridge circuit in an equivalent circuit diagram) vanishes, $\Sigma \text{Off}=0$, so that $S'-\Sigma \text{Off}_{therm}=S'-x(S''-S')=(1+x)S'-xS''$ is void of any offset.

A simple way, therefore, to measure a temperature difference between contact diffusions 406a and 406b can be as follows, where T1 is the temperature at contact diffusion 406a and T2 is the temperature at contact diffusion 406b:

$$T1-T2=(1/k)*(V(204a)-V(204b)-(V(410a)-V(410b)))$$

where k is the difference in the Seebeck coefficients of the metal lines (e.g., terminals 410a and 410b) and the polysilicon lines (e.g., interconnects 404a and 404b). This can be efficiently implemented in embodiments because V(410a)−V(410b) and V(204a)−V(204b) are already measured by signal conditioning circuitry of the sensor. Dedicated hardware, such as preamplifiers and ADCs, therefore are not needed to measure T1−T2 in embodiments. In another embodiment, T1−T' can be obtained by determining V(410a)−V(204a), and T2−T' by V(410b)−V(204b), though dedicated preamplifiers not otherwise needed by the sensor can be necessary.

Figure 5A:
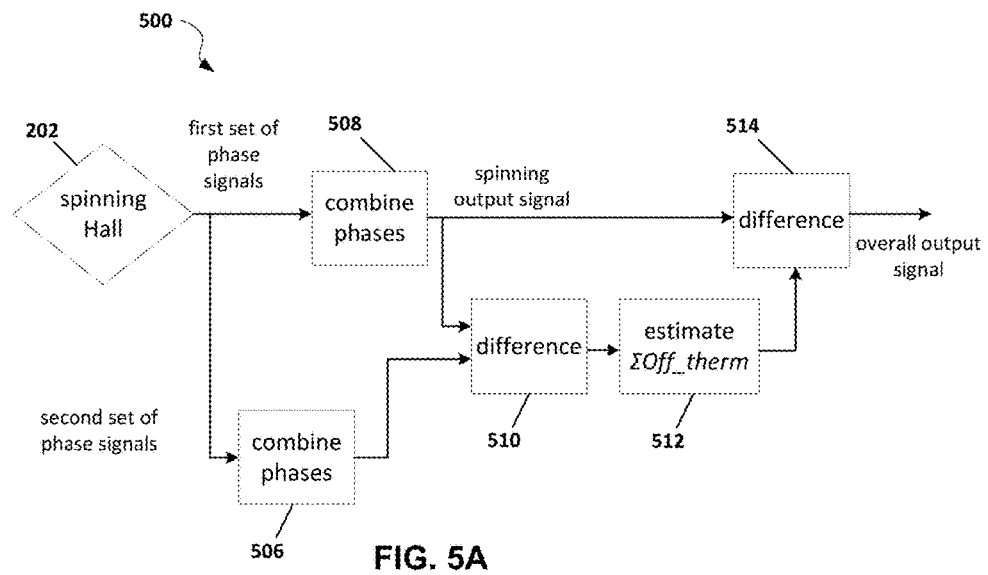
FIG. 5A is a block diagram of a sensor system according to an embodiment.

Thus, a sensor system can be depicted as system 500 as in FIG. 5A, comprising Hall plate 202. As mentioned elsewhere herein, Hall plate 202 of FIG. 5A, or any other figure (e.g., FIG. 6, FIG. 7, etc.) or embodiment whether explicitly depicted or not, can be as depicted in one of the figures (e.g., FIG. 2A or 2C), having some other configuration not explicitly depicted, or comprise a vertical Hall device (e.g., Hall device 212 of FIG. 2B or having some other configuration not explicitly depicted here). The output signals are tapped at contact diffusions 406a and 406b by elements (e.g., terminals 204a, 204b, 410a, 410b and interconnect lines 404a and 404b) forming two different material pairings which have different Seebeck coefficients as discussed above to obtain a first set of phase signals (e.g., terminals 410a and 410b, comprising metal, for example) and a second set of phase signals (e.g., interconnect lines 404a and 404b, comprising semiconductor material, for example, and tapped via terminals 204a and 204b). The signals from all phases are then combined at circuitry blocks 506 and 508, and a difference between the combined signal is determined at block 510. In an embodiment, blocks 506 and 508 can be combined and time-multiplexed, with metal or polysilicon phase signals sampled in any particular phase and then stored in a memory until combined at block 510. The output of block 510 is a measure of temperature asymmetries in the sensor during the various operating phases and/or temperature fluctuations of the contacts (e.g., contacts 204a, 204b) during the various operating phases. It may be equal to $S''-S'=\Sigma k(T_1-T_2)$. In embodiments, this should correlate with the residual offset.

This difference, the output of block 510, is then used to estimate the residual offset at block 512. Its output may be equal to $x\Sigma k(T_1-T_2)$. This estimated residual offset is then subtracted from the spinning output signal from block 508 at block 514 to obtain an overall output signal with significantly reduced or removed residual offset, e.g., according to $(1+x)S'-xS''=\Sigma F[B]$.

Figure 5B:
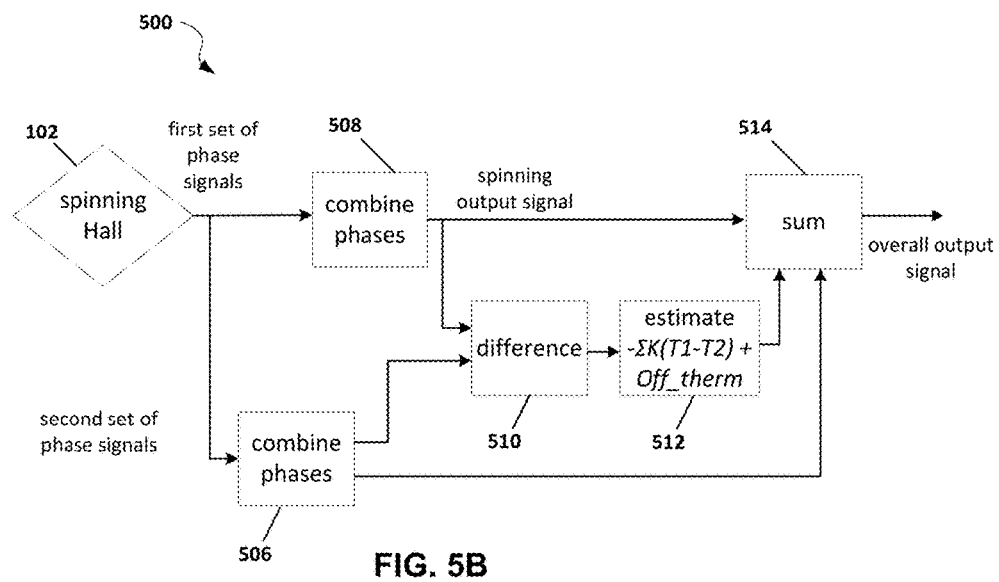
FIG. 5B is a block diagram of a sensor system according to an embodiment.

In practice, there are several different ways to implement system 500, which like system 100 of FIG. 1 is a conceptual or generalized depiction of a system and its operation according to an embodiment. In one embodiment, a first amplifier can be used for the first set of (e.g., metal) phase signals, and a second amplifier can be used for the second set of (e.g., polysilicon) phase signals. In another embodiment, the first and second sets of phase signals can be multiplexed such that, in a first spinning scheme, the first set of phase signals are amplified and processed and, in a second spinning scheme, the second set of phase signals are amplified by the same amplifier(s). This second embodiment can be more economical to implement but can be limited by bandwidth related to changes in the magnetic field between the first and second spinning schemes. Nevertheless, at low bandwidths this embodiment can be more accurate because any amplifier errors are cancelled when the two spinning output signals are combined. Another embodiment of system 500 is depicted in FIG. 5B, in which the combined second set of phase signals (i.e., the output of block 506) is also used to determine the overall output signal at block 512.

Returning to FIG. 4, FIG. 4B depicts half of the system from FIG. 4A with a modification of the couplings: instead of connecting both wires 404a, 410a directly or via tungsten plugs 403a to the contact diffusion 406a of the first sensor device 202, there can also be a short wire of length d1 between the contact diffusion 406a and the point where both wires are connected together. If d1 is much smaller than d2, the temperature T11 can be much closer to temperature T1 than to temperature T'. So the differential input pair of an evaluation circuit 499 (e.g., a preamplifier in an embodiment) measures a signal proportional to the temperature difference T'−T11, which is close to the temperature difference T'−T1. It holds that T'−T1=x'*(T'−T11). The same can be done with the second part of the system labeled with "b" in FIG. 4A, such that T'−T2=x'*(T'−T22) holds, whereby T22 is the temperature where wires 410b and 404b are shorted. If such a wiring is used in conjunction with FIG. 5A, the output of block 512 would become $x\Sigma k(T_1-T_2)=xx'\Sigma k(T_{11}-T_{22})$. This shows that the change of temperature differences $T_1-T_2$ to $T_{11}-T_{22}$ means only a small modification of the factor x to xx' for the offset compensation. If distance d1 is not small with respect to d2, this would lead to a notable degradation in the measurement of temperature differences because (i) these differences decrease, and (ii) the thermal influence of other parts of the system on $T_{11}, T_{22}$ goes up so that finally they are not any more predominantly determined by the contact temperatures $T_1, T_2$.

Figure 6A:
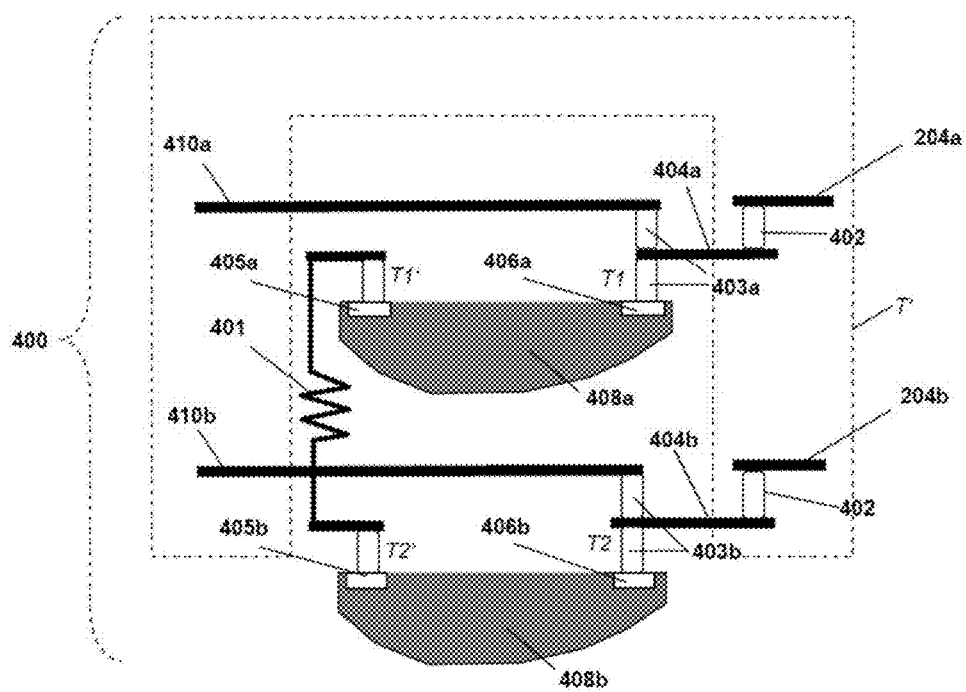
FIG. 6A is a diagram of another coupling arrangement according to an embodiment.

In another embodiment, and referring to FIG. 6A, a voltage between terminals coupled to a first contact is measured, then a voltage between terminals coupled to a second contact is measured. In other words, and referring to FIG. 6A:

$$V(204a)-V(410a)=k(404a)*(T1-T')+k(410a)*(T'-T1)$$

$$V(204b)-V(410b)=k(404b)*(T2-T')+k(410b)*(T'-T2)$$

If the Seebeck coefficients of interconnects 404a and 404b are the same, and the Seebeck coefficients of wires or terminals 410a and 410b are the same, then:

$$V(204a)-V(410a)-(V(204b)-V(410b))=k(404)*(T1-T2)+k(410)*(T2-T1)=(k(404)-k(410))*(T1-T2)$$

In FIG. 6A, regions 408a and 408b are portions of different tubs, such as two contacts, one in each of a first and second tub of a Hall device, though in other embodiments regions 408a and 408b can be in different devices or can comprise part of something other than a tub within one or different devices. A circuit 401 couples two contacts 405a and 405b of regions 408a and 408b in embodiments. Then:

$$V(204a)-V(204b)=k(404a)*(T1-T')+k(408a)*(T1'-T1)+V(1'1)+V(2'1)+V(22')+k(408b)*(T2-T2)+k(404b)*(T'-T2)V(410a)-V(410b)=k(410a)*(T1-T')+k(408a)*(T1'-T1)+V(1'1)+V(2'1)+V(22')+k(408b)*(T2-T2)+k(410b)*(T'-T2) \rightarrow V(204a)-V(204b)-(V(410a)-V(410b))==(k(404a)-k(410a))*(T1-T')+(k(404b)-k(410b))*(T'-T2)$$

Thereby a voltage drop across circuit 401 was denoted by V(2'1') and the voltage drop between 405a, 406a by V(1'1) and the voltage drop between 406b, 405b by V(22'). For $k(404a)-k(410a)=k(404b)-k(410b)$, we again obtain $V(204a)-V(204b)-(V(410a)-V(410b))$, which is proportional to (T1−T2), such that the temperature difference can be measured by a difference in signals at terminals 410a, 410b and 204a, 204b.

Figure 6B:
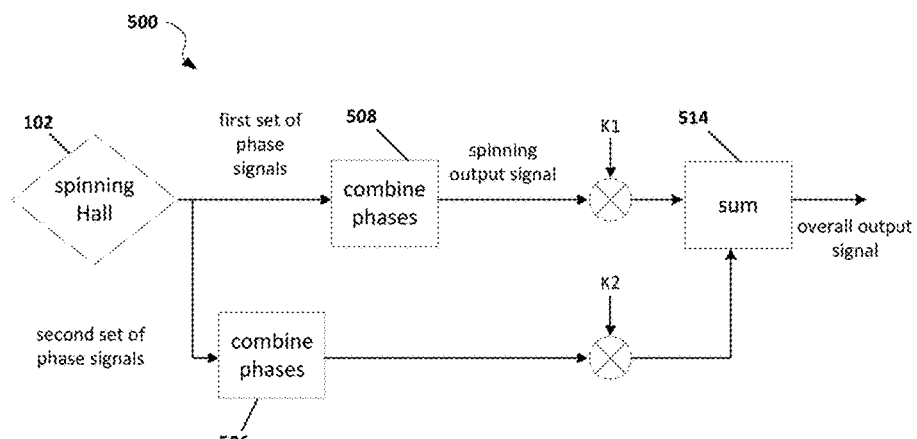
FIG. 6B is a block diagram of another sensor system according to an embodiment.
Figure 6C:
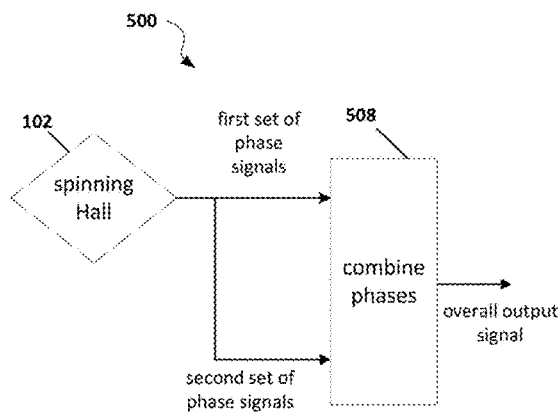
FIG. 6C is a block diagram of another sensor system according to an embodiment.

Referring also to FIG. 6B, another embodiment of system 500 comprises two multiplication factors K1 and K2, which can be chosen in order to implement the same calculations as those illustrated in and discussed with respect to FIG. 5B. In a simplified depiction, then, and referring to FIG. 6C, block 508 can carry out one or more of the methodologies depicted, at least conceptually, as being separate in FIG. 5A, 5B or 6B in a single calculation circuitry block 508.

Returning briefly to FIG. 2 and the example Hall devices depicted therein, FIGS. 2E, 2F, 2G and 2H depict four operating phases of a Hall plate 202 having four contacts 1, 2, 3 and 4. Hall plate 202 has 90-degree symmetry and is depicted as a simple square with contacts 1-4 arranged at four corners, though this can vary in embodiments. In a spinning voltage scheme having four phases 1-4, supply voltage Vs is coupled to the contact 1-4 having the same phase number, and the contact opposite that contact is coupled to a ground potential. The two remaining contacts are shorted such that the output signal is equal to the current flowing between them. For example, in FIG. 2E, phase 1 is depicted in which contact 1 is coupled to Vs and contact 3 is coupled to a ground potential. An output signal is measured between contacts 2 and 4. The output current therefore can be:

$$I_{24,1}=F_1[B]+\text{Off}_1+k(T_{2,1}-T_{4,1})+\text{Off}_{1,therm}$$

Rotating the coupling arrangement of FIG. 2E by one contact in a clockwise direction in the next three phases provides output signals of:

$$I_{31,2}=F_2[B]+\text{Off}_2+k(T_{3,2}-T_{1,2})+\text{Off}_{2,therm}$$

$$I_{42,3}=F_3[B]+\text{Off}_3+k(T_{4,3}-T_{2,3})+\text{Off}_{3,therm}$$

$$I_{13,4}=F_4[B]+\text{Off}_4+k(T_{1,4}-T_{3,4})+\text{Off}_{4,therm}$$

The first element of each equation, e.g., $F_2[B]$, represents a magnetic field dependence, which is assumed but need not be different in each phase. $\text{Off}_1$, for example represents a resistive offset term for the first phase that can depend on an applied potential and is fully defined by an equivalent circuit diagram, e.g., in the form of an asymmetric Wheatstone bridge circuit. The term $k(T_{2,1}-T_{4,1})$, for example, denotes a thermal EMF caused by thermo-coupled contacts, which can comprise aluminum or polysilicon interconnect lines (refer, for example, to FIG. 4). The final term, $\text{Off}_{1,therm}$, denotes a thermal EMF that occurs inside an active region of Hall plate 202 due to inhomogeneous temperature and/or inhomogeneous doping gradients.

The sum of the currents tapped at the metal lines (e.g., terminals 410a and 410b in FIG. 4), and for which k≈0 is:

$$I_m = \sum_{j=1}^{4} F_j[B] + \text{Off}_j + \text{Off}_{j,therm}$$

whereas the sum of the currents tapped at the polysilicon lines (e.g., interconnect lines 404a and 404b) is:

$$I_p=I_m+k(T_{2,1}-T_{4,1}+T_{3,2}-T_{1,2}+T_{4,3}-T_{2,3}+T_{1,4}-T_{3,4})$$

Thus, referring to, e.g., system 500 of FIG. 5A, the following can be determined at block 510:

$$I_p-I_m k(T_{2,1}-T_{4,1}+T_{3,2}-T_{1,2}+T_{4,3}-T_{2,3}+T_{1,4}-T_{3,4})$$

and it can be used as an input to block 512, which estimates the residual offset of the spinning voltage Hall plate caused by thermo-voltages $$\sum_{j=1}^{4} \text{Off}_{j,therm}$$

because there is a strong correlation between $$\sum_{j=1}^{4} \text{Off}_{j,therm}$$

and $(T_{2,1}-T_{4,1}+T_{3,2}-T_{1,2}+T_{4,3}-T_{2,3}+T_{1,4}-T_{3,4})$, because the latter is the origin of the former.

In this example, the common mode potential of the output signals is left free but in other embodiments can be tied to some predefined potential. These methodologies also can be applied to embodiments in which Hall contacts are used as force-sense contacts, in which the voltage or current at a force-contact is adjusted until the voltage or current, respectively, at a sense-contact is at some predefined value, such as is disclosed in co-owned U.S. patent application Ser. Nos. 13/022,844 and 13/488,709, which are incorporated herein by reference in their entireties. These contacts can be treated in the same ways as the various contacts discussed herein such that temperature sensors can be used to measure the temperature at each sense-contact, or each sense-contact is coupled to the metal lines and polysilicon interconnect lines discussed herein with reference to FIG. 4.

These and other embodiments can also comprise additional features, elements, functions and concepts. For example, systems as discussed herein can further comprise heating elements coupled to the contacts of a sensor to control the temperatures thereof, based on measurements by a temperature sensor, temperature gradient sensor or temperature sensing circuitry. Additionally or alternatively in various embodiments, a ground reference can be adjusted in order to affect the nonlinear current-voltage characteristic of a device and consequently to control a temperature of one or more contacts. Given that the resistance of a Hall element generally increases as the reverse bias voltage to its surroundings (e.g., a surrounding tub, substrate, or shallow tub as a top plate) increases, this effect can be used to control the power dissipation or the spatial distribution of power dissipation and thus the temperature distribution of the contacts of the Hall plate. Circumferential isolated structures or elements, such as pn-rings or trenches, also could be used to implement such a feature in various embodiments. A control loop can be formed in such a way so as to adjust the power dissipation or the spatial distribution of power dissipation in the Hall plate until the temperature difference signals of the temperature gradient sensors are minimized. Thereby, the adjustment can be frozen during a complete spinning cycle or it can be adjusted between operating phases within a complete spinning cycle.

Figure 7A:
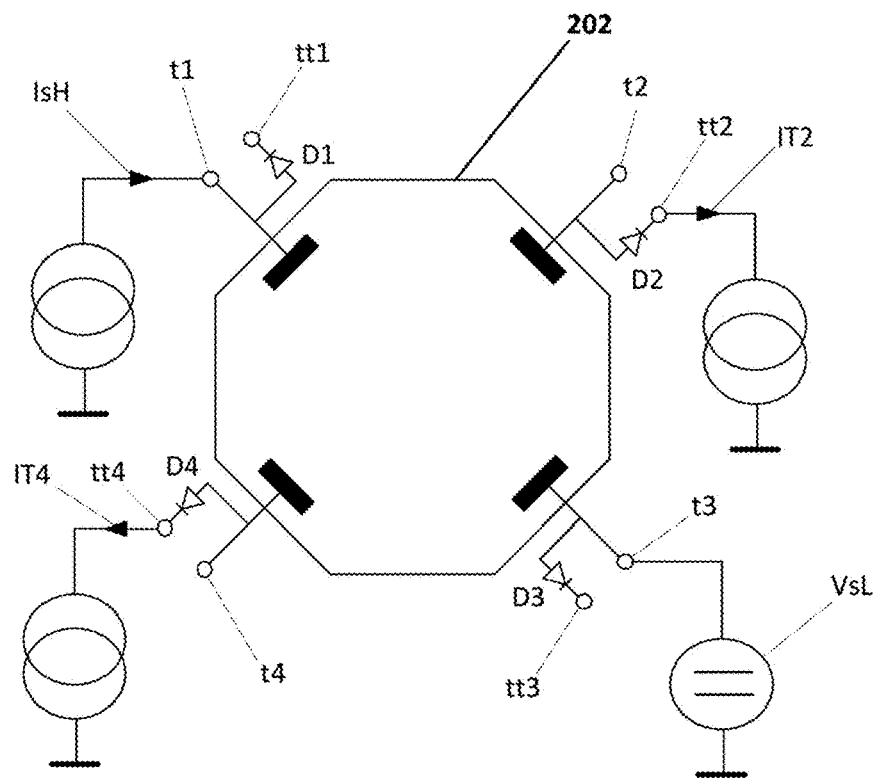
FIG. 7A is a diagram of a coupling arrangement of a Hall plate according to an embodiment.

Another embodiment of a Hall plate 202 is depicted in FIG. 7A and comprises four contacts C1, C2, C3 and C4 and four temperature sensors, which in this embodiment comprise diodes D1, D2, D3 and D4 but can comprise other devices or structures in other embodiments. Contacts C1-C4 comprise contact diffusions and are labeled in the same order as in FIGS. 2E-2H herein above. In general, the same or similar reference numerals will be used herein throughout to refer to the same or similar elements, portions, structures or other features in various drawings. In FIG. 7, a top plate of the Hall effect device is optional and not depicted.

A terminal t1, t2, t3 and t4 is coupled to each contact, i.e., t1 to C1, t2 to C2, t3 to C3, and t4 to C4. A diode D1-D4 is coupled to each contact, i.e., D1 to C1, D2 to C2, D3 to C3, and D4 to C4; and a temperature terminal tt1, tt2, tt3 and tt4 is coupled to each diode D1-D4, i.e., tt1 to D1, tt2 to D2, tt3 to D3, and tt4 to D4. In embodiments, each diode D1-D4 is arranged in intimate thermal contact with its respective contact diffusion C1-C4.

As in other embodiments, a spinning current scheme can be implemented, such that in a first operating phase of a spinning current cycle Hall plate 202 is supplied with current at supply contacts C1, C3, and a signal is tapped at signal terminals C2, C4. More precisely, a supply current IsH is injected into terminal t1 and flows into contact C1, while a second terminal t3 is tied to a reference potential VsL, such as a ground potential or some other suitably chosen potential, and a first output voltage is measured across terminals t2 and t4.

In one embodiment, currents IT2 and IT4 are drawn out of terminals tt2 and tt4, such that:

$$|IT2|+|IT4|<|IsH|$$

In embodiments, IsH is about 10 to about 100 times larger than IT2, and IT2 is equal to IT4. If current IT2 flows over diode D2, a voltage drop occurs over D2. The same is true for diode D4. Therefore, the voltage across tt4–tt2 is equal to the voltage across t4–t2 plus the difference of voltages across temperature device D2 and D4:

$$V(t4)-V(t2)=V(t4)-V(tt4)+V(tt4)-V(tt2)+V(tt2)-V(t2)$$
$$=V(D4)+V(tt4)-V(tt2)-V(D2)$$

Thus:

$$V(tt4)-V(tt2)=V(t4)-V(t2)+V(D2)-V(D4),$$

whereby the voltage V(D2) is considered to be positive if the anode of diode D2 is positive with respect to the cathode, and the same applies to diode D4. According to one embodiment, then, a first temperature output voltage is measured across terminals tt2 and tt4.

Figure 7B:
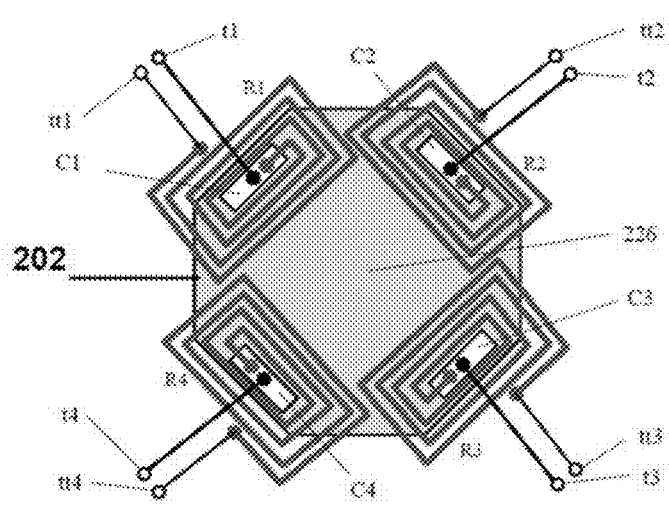
FIG. 7B is a diagram of a coupling arrangement of a Hall plate according to an embodiment.

The temperature sensors, which are depicted and described as diodes in FIG. 7A but as previously mentioned can vary in other embodiments, are chosen such that the voltage across each is a strong function of temperature. Because diodes are known to respond by about −2 mV/° C. to temperature changes, they can be suitable in embodiments. In other embodiments, however, simple resistors, such as those with a large temperature coefficient of resistivity, can be used. Low-doped tubs are common in integrated circuit technology and have temperature coefficients on the order of 5000 ppm/° C.; for voltage drops of about 1V across resistors, then, a temperature signal with a sensitivity of 1V*5000 ppm/° C.=5 mV/° C. may be achieved. A disadvantage of resistors as temperature devices, however, is their resistance, which adds to the internal resistance of Hall plate 202 and increases the noise. Diodes, in contrast, have a much smaller internal resistance which does not add much noise to the sensor signals. On the other hand, a resistance could also be implemented in layers that are above the silicon substrate and thus above the tub of the Hall effect device. For example, a poly-silicon resistor R1, R2, R3 and R4 placed above the respective contacts C1-C4 could be used, and an example of such a configuration is depicted in FIG. 7B. In general, the temperature device also can be any two-pole circuit that has a voltage which depends on temperature and, in embodiments, a low internal resistance. In particular, this circuit could employ feedback loops to reduce the resistance seen by the output signal of the Hall effect device.

Figure 7C:
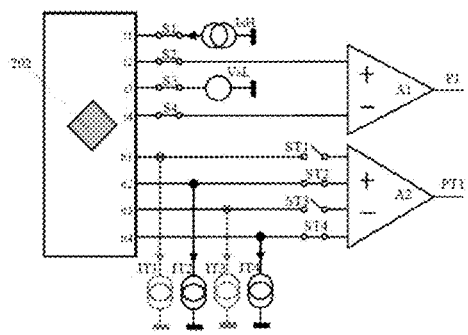
FIG. 7C is a diagram of a coupling arrangement of a Hall plate system according to an embodiment.

FIG. 7C depicts a circuit diagram which illustrates one way in which a spinning current Hall probe 202 is connected to preamplifiers A1 and A2 in a first operating phase. Switches S1, S2, S3 and S4 are configured to connect any of the terminals t1-t4 with any of current source IsH, reference voltage source VsL, and/or inputs of amplifier A1. Analogously, switches ST1-ST4 are configured to connect any of terminals tt1-tt4 with any of the inputs of amplifier A2. Current sources IT1-1T4 are configured to be switched on or off during arbitrary operating phases, whereby the shading of IT1 and 1T3 is intended to denote that IT1 and 1T3 may be off during the first operating phase (the one depicted in this figure and in FIG. 7A). Alternatively, all current sources IT1-1T4 may be on during all operating phases, which may minimize errors due to transient effects and/or self-heating. Note that the sign of the currents IT1-1T4 may be positive or negative, which means that these currents are either drawn out of Hall device 202 (positive) or injected into Hall device 202 (negative). This sign changes the common mode potential at the inputs of amplifiers A1, A2 and may be chosen appropriately. Amplifier A1 subtracts the two output signals at t2 and t4 during the first operating phase and provides a phase signal P1 at its output. Amplifier A2 subtracts two temperature output signals at tt2 and tt4 during the first operating phase and provides a phase temperature signal PT1 at its output. A2 can be identical to A1 if A1 is operated in a time multiplexed fashion in one embodiment.

The voltage across a temperature device (e.g., diodes D1-D4) can vary linearly with temperature (at least in a first order approximation):

$$V(D2)=VT20*(1+ST2*T2)$$

$$V(D4)=VT40*(1+ST4*T4)$$

where T2 and T4 are the temperatures at contacts C2 and C4, ST2 and ST4 are temperature sensitivities, and VT20 and VT40 are the voltages across D2 and C4 at zero temperature T2 and T4. If the temperature devices are identical:

$$VT20=VT40 \text{ and } ST2=ST4.$$

In most cases, however, the temperature devices have a mismatch:

$$VT20<>VT40 \text{ and } ST2<>ST4$$

Therefore:

$$V(D2)-V(D4)=VT20-VT40+VT20*ST2*T2-VT40*ST4*T4$$

The difference of voltages across both temperature devices is usually not zero, even if the temperatures are identical, i.e., T2=T4.

The system can cope with these errors if it executes a third operating phase in embodiments in which the sources IsH and VsL are swapped. Thus, in this third operating phase, current source IsH is connected to terminal t3 and reference voltage VsL is connected to t1. The temperature devices D1-D4 may be still connected the same way as in operating phase 1. Then:

$$V'(D2)-V'(D4)=VT20-VT40+VT20*ST2*T2'-VT40*ST4*T4'$$

where the apostrophe or "'" denotes this operating phase. Note that the temperatures T2' and T4' are different than T2 and T4 because the Hall device is operated with different current direction and due to small asymmetries and electrical nonlinearity this can lead to slightly different temperatures (e.g., about 0.01° C. in embodiments). The system computes the difference of differential phase temperature signals as follows:

$$V(D2)-V(D4)-(V'(D2)-V'(D4))=VT20*ST2*(T2-T2')-VT40*ST4*(T4-T4')$$

and correlates this with the thermoelectric error of the Hall output signals during both operating phases:

$$1^{st} \text{ operating phase}: V(t4)-V(t2)=S*B+k*(T4-T2)$$

$$3^{rd} \text{ operating phase}: V'(t4)-V'(t2)=-S*B+k*(T4'-T2')$$

whereby resistive offset terms are neglected because they are canceled out in the full spinning current cycle. In the overall spinning current output signal both signals of $1^{st}$ and $3^{rd}$ phase are subtracted:

$$V(t4)-V(t2)-(V'(t4)-V'(t2))=2*S*B+k*(T4-T4'-T2+T2')$$

If the same is done with the phase temperature signals then:

$$V(tt4)-V(tt2)-(V'(tt4)-V'(tt2))=2*S*B+k*(T4-T4'-T2+T2')+VT20*ST2*(T2-T2')-VT40*ST4*(T4-T4')$$

So the phase signals have an error caused by thermo-EMF:

$$k*(T4-T4'-T2+T2')$$

The phase temperature signals have an extra error caused by thermo-EMF:

$$VT20*ST2*(T2-T2')-VT40*ST4*(T4-T4')$$

The system can compare both (e.g. by subtracting them). Thus, the system can measure the following:

$$VT20*ST2*(T2-T2')-VT40*ST4*(T4-T4')$$

By characterization in the laboratory it is possible to establish a typical relationship between $k*(T4-T4'-T2+T2')$ and $VT20*ST2*(T2-T2')-VT40*ST4*(T4-T4')$. Such a relationship will vary from device to device, from production lot to lot, but it should be stable over the lifetime of a particular device (i.e., as long as VT20*ST2 and VT40*ST4 are stable, which is generally true in practice if stable pn-junctions or stable resistors or other stable devices are used). This typical relationship can be used in an algorithm of the sensor system to estimate the termo-EMF-error in the phase signals and finally to compensate for it (e.g. by subtracting the expected error from the phase signals).

For example, suppose that there is no mismatch between the two temperature devices D2 and D4. Then the extra error due to thermo-EMF in the phase temperature signals is $$V(tt4)-V(tt2)-V'(tt4)+V'(tt2)-V(t4)+V(t2)+V'(t4)-V'(t2)=VT0*ST*(T2-T2'-T4+T4')$$

where we used VT0=VT20=VT40 and ST=ST2=ST4. If this is multiplied by an appropriate factor and added to the original phase signals in the spinning scheme, the thermo-EMF of the Hall effect device may be canceled:

$$Vcomp = V(t4)-V(t2)-V'(t4)+V'(t2)-x*\{V(tt4)-V(tt2)-V'(tt4)+V'(tt2)-V(t4)+V(t2)+V'(t4)-V'(t2)\}=2*S*B+k*(T4-T4'-T2+T2')-x*VT0*ST*(T2-T2'-T4+T4')=2*S*B$$

for $$k+x*VT0*ST=0$$

or $$x=-k/(VT0*ST)$$

We call Vcomp the thermo-EMF-compensated signal. This factor x can be determined empirically, though an approximation can be determined theoretically: If a diode is used as a as temperature device, then $$VT0*ST=-2 \text{ mV/}° C.$$

and k is the Seebeck-coefficient of, e.g., a low n-doped Hall region with k=−1500 µV/° C. which gives $$x=-(-1.5 \text{ mV/}° C.)/(-2 \text{ mV/}° C.)=-0.75$$

Thus, the thermo-EMF-compensated signal in the first operating phase is obtained by $$(1+x)*\{V(t4)-V(t2)\}-x*\{V(tt4)-V(tt2)\}$$

and in the third operating phase it is given by $$(1+x)*\{V'(t4)-V'(t2)\}-x*\{V'(tt4)-V'(tt2)\}$$

and in the overall spinning scheme both signals are subtracted.

Thus, the thermo-EMF-compensated signal is a linear combination of differential phase signals (e.g., V(t4)−V(t2)) and differential phase temperature signals (e.g., V(tt4)−V(tt2)), both of the same phase. In the above case, the phase temperature signals are weighted with a factor that is three times larger than the traditional phase signals: −x/(1+x)=−(−0.75)/(1−0.75)=3. Thus, the dominant part of the signal comes from the phase temperature signals, with only a minor portion from the traditional phase signals, a distinction with respect to conventional approaches. Of course, the weight of differential phase temperature signals versus differential phase signals depends on the temperature sensitivity of the temperature sensor. As seen above, the linear combination is independent on the phase: the same factor x is present for first and third phases. The devices D2 and D4, however, are assumed to match perfectly. If other devices D1 and D3 are used in the second and fourth phases of a spinning Hall cycle, e.g., according to FIGS. 2E-H and they have different VT0 and ST parameters, this will also affect x. So, generally in so-called orthogonal operating phases, i.e., phases with different signal contacts (phases 1 and 2 are orthogonal, yet 1 and 3 are not orthogonal), the linear combination for the thermo-EMF-compensated signal is different. Yet in non-orthogonal phases such as phases obtained by reversing the polarity of the supply voltage or supply current, the linear combination for the thermo-EMF-compensated signal is usually identical.

One basic aspect of various embodiments is that the thermal symmetry of the Hall effect device with respect to supply reversal can be optimized. If this is achieved for all systematic effects (like, e.g., geometric symmetry), there will always be some statistical asymmetries (like, e.g., geometric asymmetries due to manufacturing tolerances), which cause temperature differences between contacts that should have identical temperatures without manufacturing tolerances. These temperature differences can be measured by temperature-difference sensors (i.e., sensors of spatial gradient of temperature) and from these measurements corrective values are deduced online that cancel offset caused by thermo-EMFs, if these values are added to (not multiplied with) the Hall effect signal. This feature of adding the offset-correction value to the uncompensated signal in order to get the compensated signal can also be seen in the block diagrams in FIGS. 1, 2I, 5A, 5B and 6B. This distinguishes embodiments of offset-compensation from conventional temperature compensation approaches which multiply an uncompensated Hall signal by some appropriate function of temperature (i.e., a temperature sensor signal) in order to get a compensated signal with e.g. temperature independent behavior. These conventional temperature compensation systems trim the gain of the system as a function of temperature, whereas embodiments disclosed herein trim the offset of the system as a function of temperature gradient.

Now, however, suppose that there is a mismatch between two temperature devices D2 and D4. The mismatch can occur in VT20<>VT40 or in ST2<>ST4, or in both. We saw above that the subtraction of signals of first and third operating phases cancels the VT20 and VT40 terms, which is desired. Since the extra error due to thermo-EMF in the phase temperature signals is VT20*ST2*(T2-T2')-VT40*ST4*(T4-T4'), the system only has to deal with mismatches between VT20*ST2< >VT40*ST4. Thus, we can say VT40*ST4=VT20*ST2*(1-MM), where MM is the mismatch between D2 and D4. The extra error due to thermo-EMF in the phase temperature signals is $$VT20*ST2*(T2-T2')-VT20*ST2*(T4-T4')*(1-MM)$$
$$=VT20*ST2*(T2-T2'-T4+T4')+MM*VT20*ST2*(T4-T4')$$

Thus, in the presence of mismatch of temperature devices, the system does not measure T2-T2'-T4+T4', but rather:

$$T2-T2'-T4+T4'+MM*(T4-T4')$$

Consequently, the error is moderate as long as T4-T4' is similar to T2-T2'-T4+T4'. The error is large, however, when |T4-T4'|>>|T2-T2'-T4+T4'|. In other words: The fluctuation of temperature at an output contact in two operating phases with reversed supply voltage or current should not be large against the fluctuation of temperature difference between both output contacts in these operating phases. This means that the total power dissipation in the Hall effect device should change as little as possible when the supply is reversed. It also means that the power density near the output contacts should remain as constant as possible when the supply is reversed. Therefore, the operating conditions should be such that the common-mode potentials at the output contacts should remain identical or nearly so when supply is reversed in embodiments.

Figure 7D:
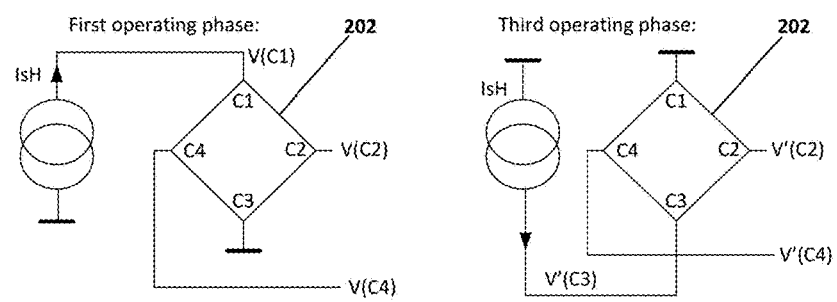
FIG. 7D is a diagram of a coupling arrangement of a Hall plate in two operating phases of a spinning current scheme according to an embodiment.
Figure 7E:
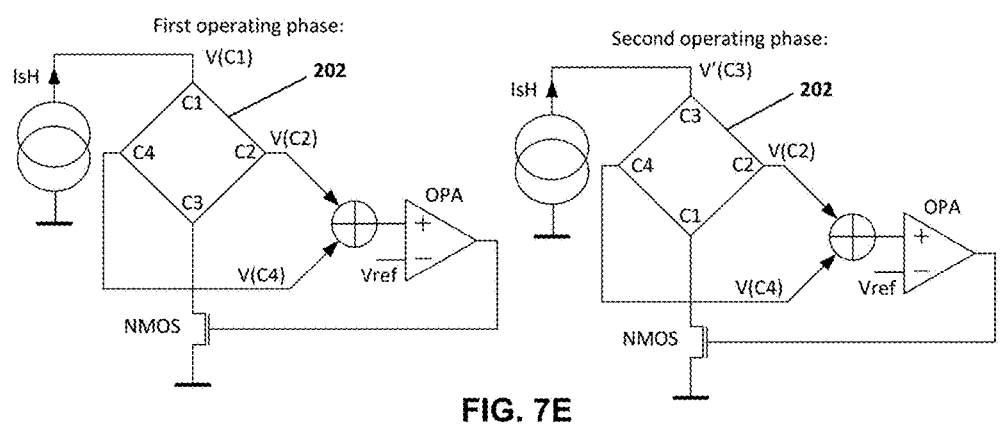
FIG. 7E is a diagram of a coupling arrangement of a Hall plate in two operating phases of a spinning current scheme according to an embodiment.

This is illustrated, for example, in FIG. 7D and 7E. FIG. 7D depicts a Hall plate 202 with four contacts C1-C4, which is biased in an undesirable way because the common mode potential (0.5*V(C2)+0.5*V(C4)) changes when the supply voltage is reversed due to the electrical nonlinearity of the Hall effect device. The common mode output voltage is slightly below half of the supply voltage due to electrical nonlinearity of the device. Thus, it is about 0.45*V(C1) in the first operating phase and 0.45*V'(C3) in the third operating phase. Assuming a perfectly symmetric Hall effect device, then V(C1)=V'(C3), i.e., the supply voltage is identical if the supply currents are identical but with different polarities. The common mode output voltages also are identical in both phases, and consequently the temperature T2 should be very similar to T2' (and also T4 should be similar to T4'). Yet if the Hall effect device is slightly asymmetrical such that contact C1 is, e.g., about 1% smaller than C3, this will lead to V(C1) being different from V'(C3), and then also the common mode output voltages in both phases are different. Additionally, the temperatures T2 and T2' (or T4 and T4') should differ significantly more than before.

FIG. 7E shows the same device biased in a more advantageous way, wherein the common mode potential is controlled to be at the same level when the supply is reversed. The operational amplifier OPA compares the reference voltage Vref with the sum V(C2)+V(C4). If the sum is the larger of the two, the output of op-amp OPA goes up, which pulls the gate of the NMOS up such that the NMOS sinks more current, which in turn pulls V(C2) and V(C4) down. Thus the common mode is controlled to a value of Vref/2.

There are numerous other ways to keep the common mode potential at fixed values during parts of the spinning Hall scheme, and the examples discussed herein are not limiting. Many of these schemes are advantageous because they reduce the matching requirements for the temperature devices, e.g., diodes D2 and D4. A goal, generally, is to keep the common mode potential of the output constant when the supply is reversed, though the differential potential V(C2)-V(C4) is still free to output the magnetic field signal. If the common mode potential is constant, the power density and thus the temperature distribution also should be constant. Note that the common mode potential can have various kinds of influences on the Hall region: if the Hall region is isolated against the environment by a reverse biased pn-junction, as is typical, the common mode potential determines the reverse bias and this determines the width of the depletion layer, which defines the active width of the Hall region. The thinner the active Hall region, the higher its resistance will be. On the other hand, the common mode potential may affect the number of free charges in the active Hall region or at least in parts of it (e.g., through charge accumulation effects), and this also affects the resistance. The resistance also affects the power dissipation and thus the temperature distribution in the device.

In embodiments, the system estimates T2-T4-T2'+T4', as was illustrated in the discussion herein above of the simple case with perfect matching. Mismatch will lead to reduced accuracy in this estimation, but a level of accuracy that is desired or required can vary. In embodiments, the temperature differences T2-T4 in differential outputs of Hall effect devices as low as about 0.001° C. can be estimated. This provides a thermo-EMF-voltage of about 1.5 µV for a Seebeck coefficient of 1500 µV/° C. A typical Hall effect device has a magnetic sensitivity of about 50 mV/T when operated at a 1V supply, such that 1.5 µV corresponds to a 30 µT offset. This offset occurs at all phases of a spinning Hall probe, and it is stochastic, whereby the offsets in orthogonal phases are presumably statistically independent and also in the non-orthogonal phases should be basically independent. Thus, if a spinning scheme has 4 operating phases, the residual offset should be about sqrt(4), or 2 times lower. This gives a residual offset of about 15 µT, which generally corresponds with observations by the inventor in the laboratory.

When a Hall effect device is operated in a spinning Hall scheme, the temperature will also vary with each new operating phase. Moreover, the system has a certain latency due to the thermal mass of the circuit devices, and this can lead to the temperature in the n-th operating phase also being influenced to a certain degree by the temperature during the (n−1)-th or, in general, any of the preceding operating phases. Referring again to FIG. 2E, which shows a Hall effect device operated in a first phase, the contact at highest potential (C1) will also attain the highest temperature due to the electrical nonlinearity of the device, whereas the grounded contact C3 has the lowest temperature. If the second operating phase shown in FIG. 2F follows shortly after the first one, contacts C1 and C3 changed roles: in phase 1 each was a supply contact, whereas in phase 2 each is now a signal contact. As C1 was slightly warmer than C3, this gives a temperature difference between these two output contacts in the start of phase 2. Consequently, it also provides a thermo-EMF voltage, which causes an offset error. If phase 2 lasts notably longer than the thermal time constant of the Hall effect device, contacts C1 and C3 will eventually—at the end of phase 2—be at identical temperatures, if perfect symmetry of the device is assumed. Thus, a transient temperature difference between the output contacts can occur so that it changes during a phase, and the duration of the operating phase can have a significant impact on these effects: if the spinning Hall scheme is executed very slowly these transient effects may be ignored, yet, if it is executed very fast the temperature during an operating phase may be predominantly determined by prior operating phases and only to a negligible extent by the current operating phase. Moreover, the system measures Hall signals and temperature differences synchronously: at every point in time, when the Hall signal is measured the thermo-EMF error is part of this Hall signal and therefore the system should know the temperature differences at the output contacts for these points in time, too.

Here, however, two types of systems may be distinguished: integrating systems and sampled systems. An integrating system such as, e.g., a continuous time sigma-delta analog-to-digital converter (CT-SD-ADC) integrates the Hall output signal during a certain time interval, e.g., during the entire operating phase. In such a case the system can also integrate the temperature-difference between the output contacts synchronously. Alternatively, a successive approximation analog-to-digital converter (SAR-ADC) usually samples the Hall signal, which means it freezes the value using a sample-and-hold technique and then converts this static value. In this case also the temperature difference of the output contacts can be sampled at the same time the Hall signal is sampled.

Figure 8A:
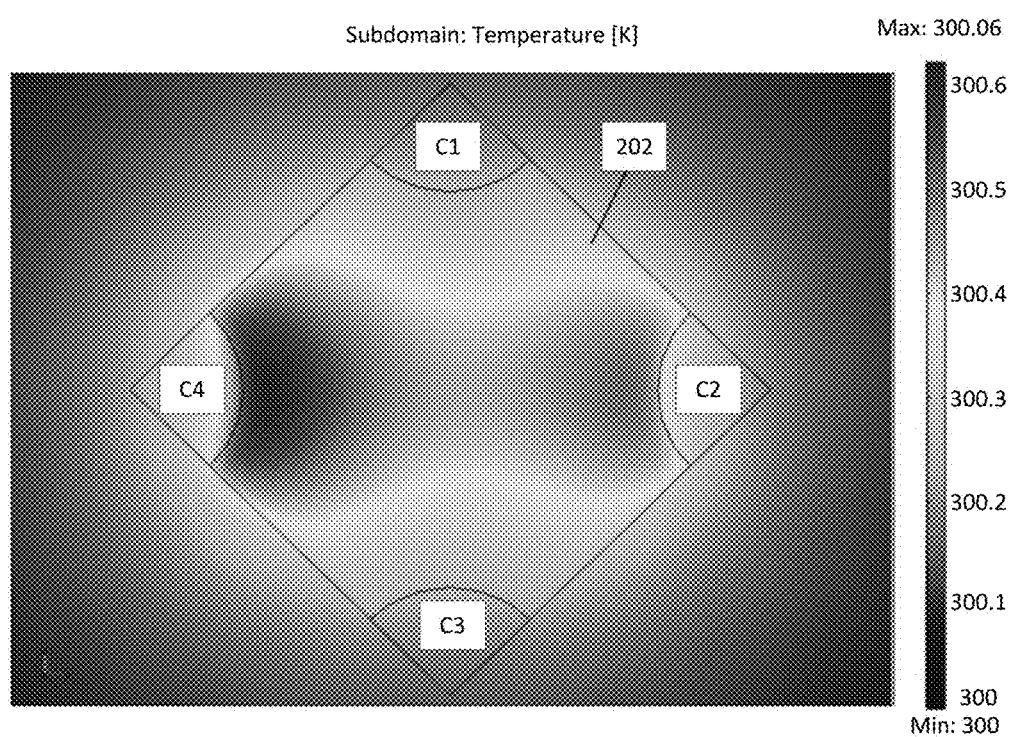
FIG. 8A is a depiction of a temperature distribution in a Hall plate according to an embodiment.

Under static conditions the temperature distribution in a 100 µm×100 µm-square silicon Hall plate with 5 µm thickness and typical nonlinearity, operated at 3V supply in phase 4 of FIG. 2H, is depicted in FIG. 8A. As can be seen, contact C4 is at highest potential and also at highest temperature, about 0.062° C. above a room temperature of 300 K.

Figure 8B:
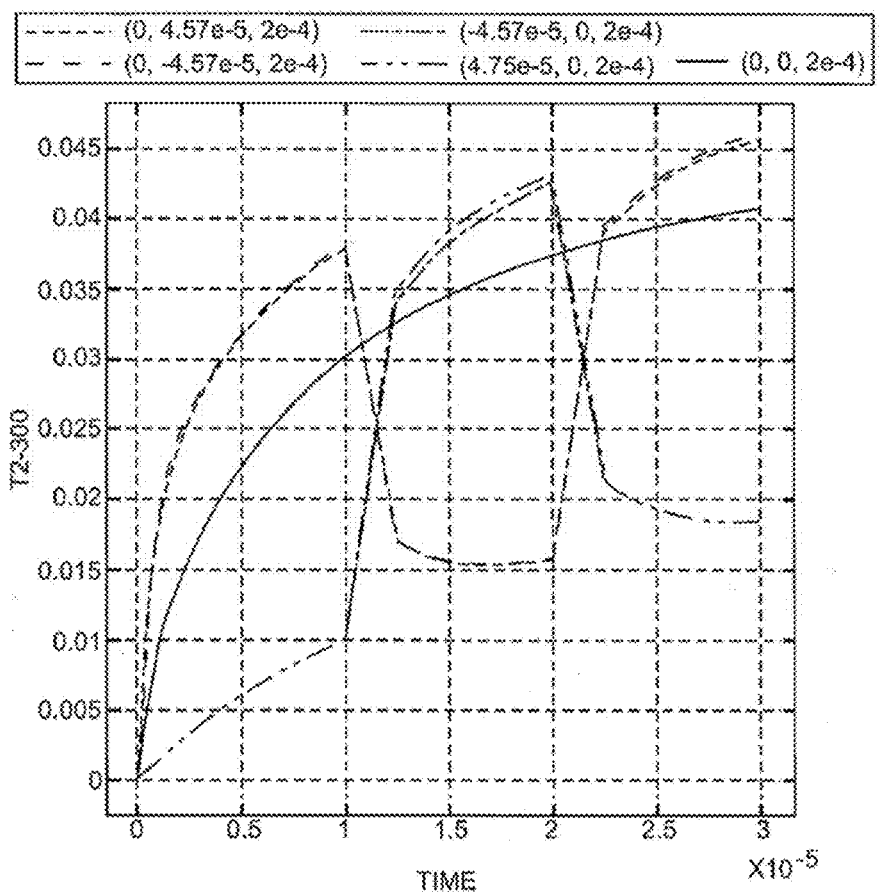
FIG. 8B is a depiction of transient temperature behavior of a Hall plate in a spinning current scheme according to an embodiment.

FIG. 8B depicts the transient temperature behavior of several points in Hall plate 202 of FIG. 8A during a spinning Hall cycle. The pulse-shaped curves denote temperatures of the four contacts, whereas the smooth curve is the temperature in the center of Hall device 202 (e.g., active area 226). In this embodiment, each operating phase is about 10 µs long, and there is 300 K initially before the device is powered up. Thus, fast thermal time constants of about 1-2 µs can be seen. Two different pulse "teeth" in each operating phase are also present, which is the high and low potential supply contacts, and two equal "valleys," which are the output contacts. The temperature difference between supply and signal contacts is about 0.03° C., whereas the temperature difference between both supply contacts is less than about 0.001° C.

If the initial mismatch between diodes D2-D4 is too large, the system can perform an auto-calibration in embodiments. In one embodiment, therefore, a heating element can be used which is designed in such a way as to generate the same temperature on D2 and D4. This heating element can be activated for a certain period of time and then the output of D2-D4 measured (i.e., either once in an end-of-line calibration, or during power-up of the sensor system, or repeatedly, e.g., every 100 ms). If the output changes when the heating element is activated, this change is stored and subsequently subtracted from each measurement and used for correction of subsequent measurements.

For example, if the heating element is off, voltages across the temperature diodes D2-D4 are V(D2), V(D4) and the temperatures at the diodes are T2, T4, respectively. If the heating element is on, the voltages are V"(D2), V"(D4) with temperatures T2+dT and T4+dT, respectively. The system can measure these voltages and compute (V(D2)−V(D4)−V"(D2)+V"(D4))/(V(D2)−V"(D2)), which is equal to 1+VT40*ST4/(VT20*ST2), which gives the mismatch of temperature sensitivities of both temperature sensors.

Alternatively, some parameter of one or both of diodes D2 or D4 can be adjusted to reduce the observed change in D2-D4-output to zero. For example, if D2 and D4 are diodes or resistors, as discussed above, the system could change the current IT2 through D2 until the temperature difference observed at D2-D4 does not depend on the heating element being on or off. This procedure can trim the sensitivity of D2 to match D4. Even though the change in IT2 also changes the self-heating of the temperature sensor, this generally has no adverse effect on the system as long as this self-heating is the same during on- and off-times of the heater.

Note that usually there are different temperatures at D2 and D4 due to operation of the Hall effect device or other heat sources present in the system. Therefore, the system can extract only the difference in temperature difference between heating element on and off, so only the superimposed temperature difference caused by the symmetric heating element is relevant. The heating element for auto-calibration should be perfectly symmetric with respect to both temperature sensors D2 and D4 (and for orthogonal phases either the same or a different heating element needs to be perfectly symmetric to D1 and D3) in embodiments so that it generates the same temperature increase at D2 and D4 (up to better than 1%, such as 0.1% or even better, if possible, in embodiments). There are several approaches which can be used to achieve this: for example, either one heating element is placed symmetrically with respect to both temperature sensors D2 and D4 (or other diodes or temperature sensing devices, as the case may be in any particular embodiment or configuration, with the examples here relating the depiction in the drawings for convenience only), or each temperature sensor has its own dedicated heating element. In the second case the heating elements should match perfectly, such that now it can be seen that the problem of mismatch has merely been shifted from D2-D4 themselves to their respective heating elements. This still may be a viable option, however, if the mismatch of the heating elements is less than the mismatch of the temperature devices. Even in this case it can be beneficial to make the spacing between temperature sensor and respective heating element sufficient as every small change in layer thickness or other details may have a large effect on the temperature excursion on the temperature sensor caused by the heater.

For example, suppose both D2 and D4 are diodes and have heating elements HT2 and HT4, which comprise resistive strips placed above them. Resistive strips and this particular placement are but one example of suitable heating elements and arrangement. Even if HT2 and HT4 match perfectly, it is likely that the thickness of an intermetal dielectric or some other structure between HT2 and D2 differs by, e.g., 1% from the same structure between HT4 and D4. This is all the more likely since the vertical spacing between HT2 and D2 is only about 1 µm or similar. Although HT2 generates the same heat and heat density as HT4, the temperatures at D2 and D4 would differ. The situation improves, however, if the spacing between D2 and HT2, and also between D4 and HT4, is increased, e.g., by a lateral distance of about 10 µm. Then the thermal coupling is less intimate but more stable against production tolerances. On the other hand, the larger the distance between D2 and HT2, the larger the influence the surrounding area and structures arranged there can have on the thermal coupling between them. Therefore, it can be advantageous for the layout of other circuit devices around D2-HT2 and D4-HT4 to be symmetrical in order to have exactly the same thermal coupling between D2-HT2 and D4-HT4. The same holds if only a single heating element is used for both D2 and D4; then the mismatch between HT2 and HT4 is avoided. Of course, it is typically impractical in practice to have the layout of the entire system symmetrical with respect to the heating element and all temperature sensors D1-D4. Thus, in embodiments, it can be made symmetric within a certain distance, whereas at large distances the symmetry can be imperfect so long as the coupling of the heat source and temperature sensors is still strong enough. With the above given numbers one can estimate if a certain asymmetry is still acceptable: If the mismatch should be reduced to about 0.1% due to auto-calibration, the thermal coupling between the heating element and D1-D4 must match at least up to about 0.1%. Any asymmetry can be modelled in a numerical computer code (e.g., a finite element simulation) and the thermal coupling can be studied.

Figure 9:
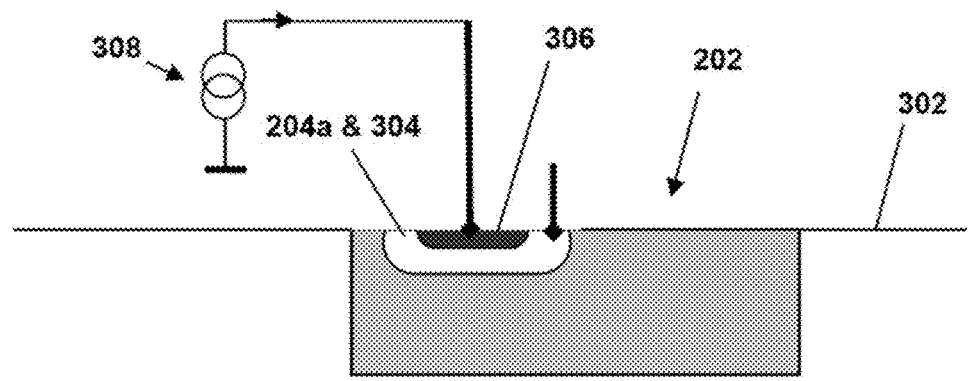
FIG. 9 is a side cross-sectional view of an arrangement of a sensor device according to an embodiment.

If the main sensor has contact diffusions of a first conductivity type (e.g., a Hall sensor has n-doped contact diffusions), then it may be possible to place smaller diffusion tubs of a second, opposite conductivity type within the contact diffusions of the first conductivity type. In the case of the Hall sensor this would be smaller p-tubs within n-tubs. This gives pn-junctions which could be used as temperature device of this respective contact. One example is depicted in FIG. 9, which is a version of FIG. 3 discussed above. Such a configuration can save space and make the thermal coupling between contacts and temperature sensors more intimate. In an embodiment, contact 204a can be ring-shaped, completely encircling tub 306 when viewed from the top (as opposed to the side cross-sectional view of FIG. 9) so that the current flowing into/out of the temperature device does not affect the potential distribution in the main sensor. Note that FIG. 9 is a schematic view of a single contact having an integrated pn-temperature diode; in practice, Hall-effect devices such as Hall plates or vertical Hall-effect devices typically have three or more contacts each having such a pn-junction. In general, all contacts which are used to tap a signal in at least one phase of a spinning Hall scheme should have such a pn-junction.

Thus, various embodiments of sensors, systems and methods for compensating for the effects of thermal EMF have been discussed herein, with reference to several example embodiments and depictions that are not limiting to the overall concepts. For example, which examples related to Hall effect sensors have been discussed, other sensor types can be used, including other magnetic field sensors, mechanical stress sensors, and others. In general, however, the residual offset can be correlated to temperature fluctuations at sensor contacts, which can in turn be correlated with thermal EMFs, and residual offset can be reduced or eliminated by adding a correction term or compensation signal, or by implementing a control loop, based on sensed temperatures at one or more sensor contacts.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A sensor configured to sense a physical quantity comprising:

a first electrically conducting region of a substrate comprising a first contact;
a first terminal coupled to the first contact and comprising a material having a first effective Seebeck coefficient;
a second terminal coupled to the first contact and comprising a material having a second effective Seebeck coefficient, wherein the first effective Seebeck coefficient and the second effective Seebeck coefficient are different; and
circuitry selectively coupled to the first and second terminals to tap first and second signals and combine the first and second signals.

2. The sensor of claim 1, further comprising:
a second electrically conducting region of the substrate comprising a second contact;
a third terminal coupled to the second contact and comprising a material having a third effective Seebeck coefficient; and
a fourth terminal coupled to the second contact and comprising a material having a fourth effective Seebeck coefficient, wherein a difference between the first and second effective Seebeck coefficients is equal to a difference between the third and fourth effective Seebeck coefficients,
wherein the circuitry is selectively coupled in at least one operating phase of the sensor to at least two of the first terminal, the second terminal, the third terminal and the fourth terminal to tap the first and second signals.

3. The sensor of claim 2, wherein the first signal is measured between the first and third terminals, and the second signal is measured between the second and fourth terminals.

4. The sensor of claim 2, wherein the first and third effective Seebeck coefficients are equal to one another, and wherein the second and fourth effective Seebeck coefficients are equal to one another.

5. The sensor system of claim 1, wherein the sensor comprises a Hall effect sensor element.

6. The sensor system of claim 5, wherein the sensor is configured to be operated in a spinning scheme comprising at least two operating phases, wherein a spatial distribution of current in the sensor is different in each of the at least two operating phases.

7. The sensor system of claim 1, wherein the first terminal and the third terminal consist of a metal material, and wherein the second terminal and the fourth terminal consist of a semiconductor material.

8. A method comprising:
obtaining a first set of signals in a plurality of operating phases by sensing a magnetic field at a set of contacts tapped by a first set of terminals having a first effective Seebeck coefficient;
obtaining a second set of signals in the plurality of operating phases by sensing a magnetic field at the set of contacts tapped by a second set of terminals having a second effective Seebeck coefficient different from the first effective Seebeck coefficient; and
combining the first and second sets of signals.

9. The method of claim 8, further comprising using the combined first and second sets of signals to reduce a residual offset in a magnetic field output signal.

10. The method of claim 9, wherein the residual offset is related to a thermal electromotive force (EMF).

11. The method of claim 8, wherein the first effective Seebeck coefficient is related at least in part to a first material and the second effective Seebeck coefficient is related at least in part to a second material different from the first material.

12. The method of claim 11, wherein the first material comprises a metal and the second material comprises a semiconductor.

13. The method of claim 8, wherein the plurality of operating phases comprise a spinning scheme of operating a sensor device.

14. The method of claim 13, further comprising providing at least one heating element configured to at least reduce a temperature difference between ones of the set of contacts or calibrate a temperature gradient sensor.

* * * * *